United States Patent [19]

Lasch, Jr. et al.

[11] 3,930,684
[45] Jan. 6, 1976

[54] AUTOMATIC WAFER FEEDING AND PRE-ALIGNMENT APPARATUS AND METHOD

[76] Inventors: Cecil A. Lasch, Jr., 21230 Homestead Road, Cupertino, Calif. 95014; Laszlo Sipos, 18883 Allendale Ave., Saratoga, Calif. 95070; Karl Ursprung, 3655 Pruneridge Ave., Santa Clara, Calif. 95051

[22] Filed: Oct. 9, 1973

[21] Appl. No.: 404,287

Related U.S. Application Data

[63] Continuation of Ser. No. 155,499, June 22, 1971, abandoned.

[52] U.S. Cl............... 302/2 R; 198/257; 221/173; 355/73
[51] Int. Cl.[2]........................................ B65G 47/24
[58] Field of Search............... 198/33 AB, 261, 257; 221/173; 302/2 R, 29, 31; 355/73

[56] References Cited
UNITED STATES PATENTS

| | | | |
|---|---|---|---|
| 2,293,553 | 8/1942 | Magnusson | 198/33 AB |
| 2,791,314 | 5/1957 | Meier | 221/173 X |
| 2,855,740 | 10/1958 | Noland et al. | 198/37 X |
| 2,878,954 | 3/1959 | Troske | 221/173 X |
| 3,297,134 | 1/1967 | Pastuszak | 193/43 R X |
| 3,415,350 | 12/1968 | Murphy | 198/261 |
| 3,441,121 | 4/1969 | Pastuszak | 198/33 AB |
| 3,618,742 | 11/1971 | Blanchard | 198/33 AB |
| 3,645,581 | 2/1972 | Lasch et al. | 302/2 R |
| 3,651,985 | 3/1972 | Smith | 198/37 X |

OTHER PUBLICATIONS

Western Electric Technical Digest No. 5, Jan. 1967, p. 11.

*Primary Examiner*—Evon C. Blunk
*Assistant Examiner*—Jeffrey V. Nase
*Attorney, Agent, or Firm*—Flehr, Hohbach, Test, Albritton & Herbert

[57] ABSTRACT

Improved apparatus and method for automatically withdrawing silicon wafers or like articles from a supply magazine, transporting the same on a fluid bearing to a station where such articles are pre-aligned in sequence prior to treatment thereof at an adjacent mask aligner or like mechanism, and automatically discharging the articles following such treatment thereof onto another fluid bearing for transportation thereof into a discharge magazine. Improved sensor means is provided in conjunction with the supply magazine and discharge magazine for automatically indexing such magazines to feed and receive wafers in sequence moving relative thereto.

During pre-alignment operation, each wafer is automatically rotated on an air bearing until it is oriented with a flat edge surface thereof in a predetermined position, which position is maintained as the wafer is transferred into the mask aligner where fine orientation thereof is completed, either manually or automatically, in accordance with the type of mask aligner apparatus with which the pre-alignment apparatus of this invention is combined.

62 Claims, 17 Drawing Figures

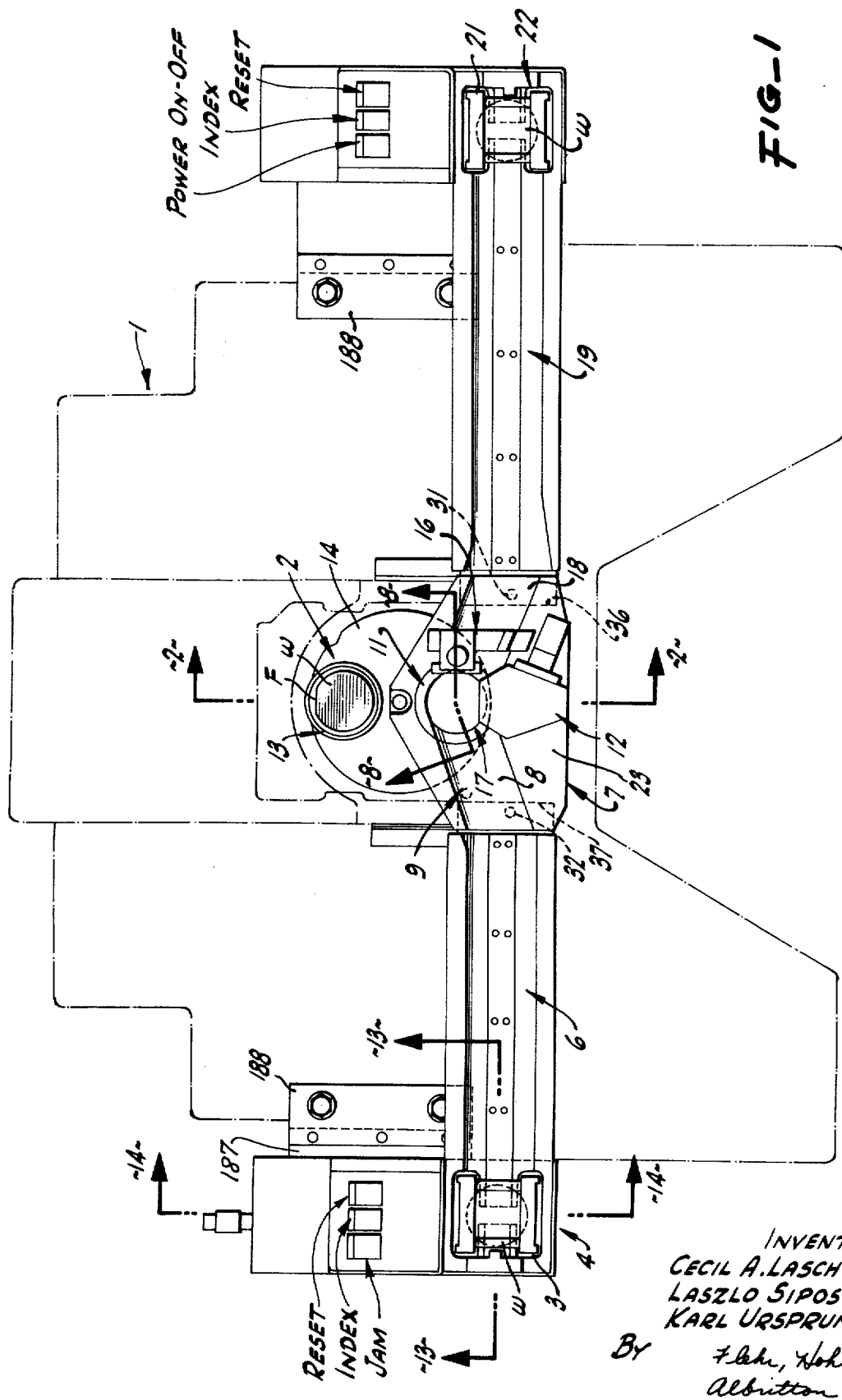

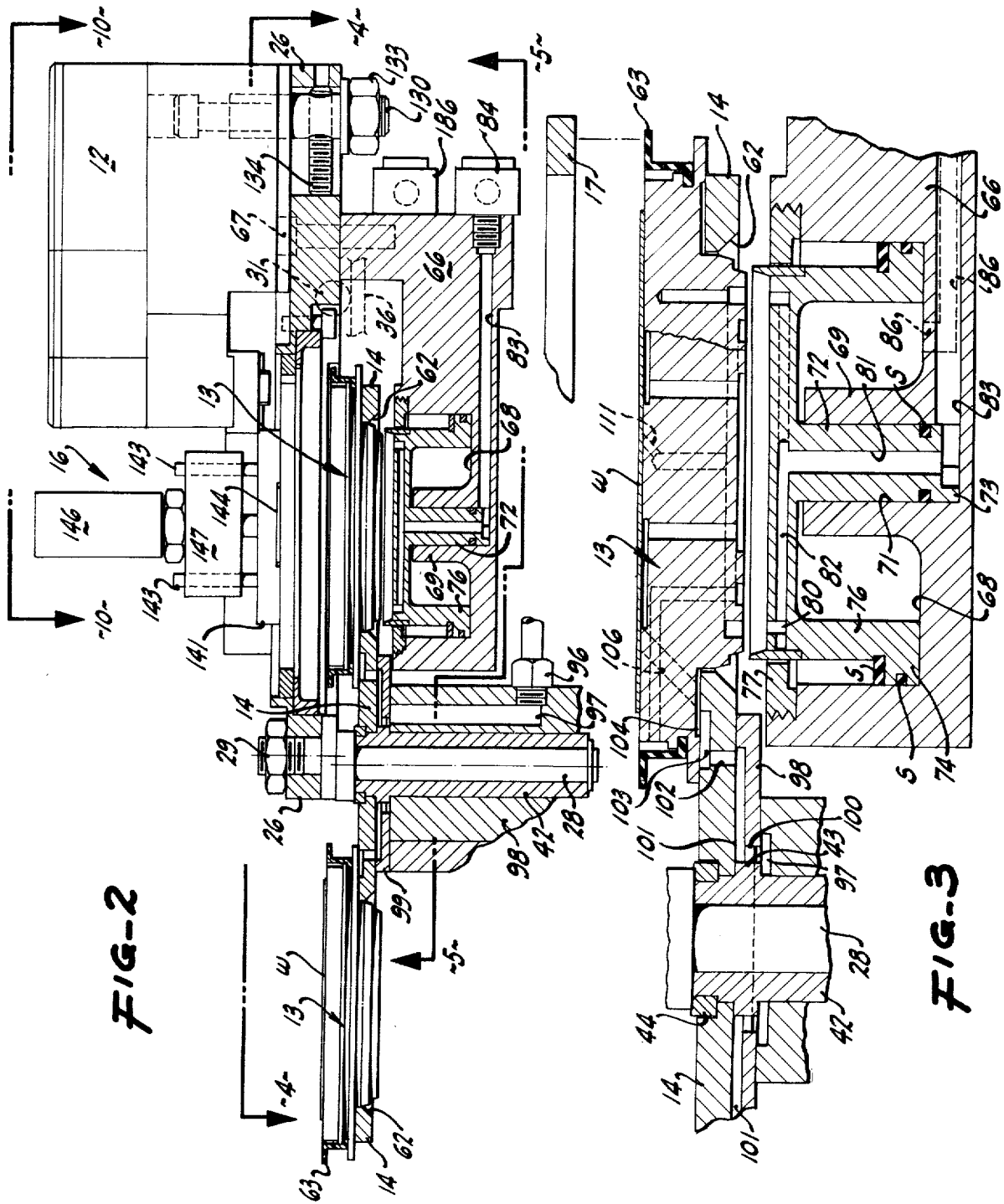

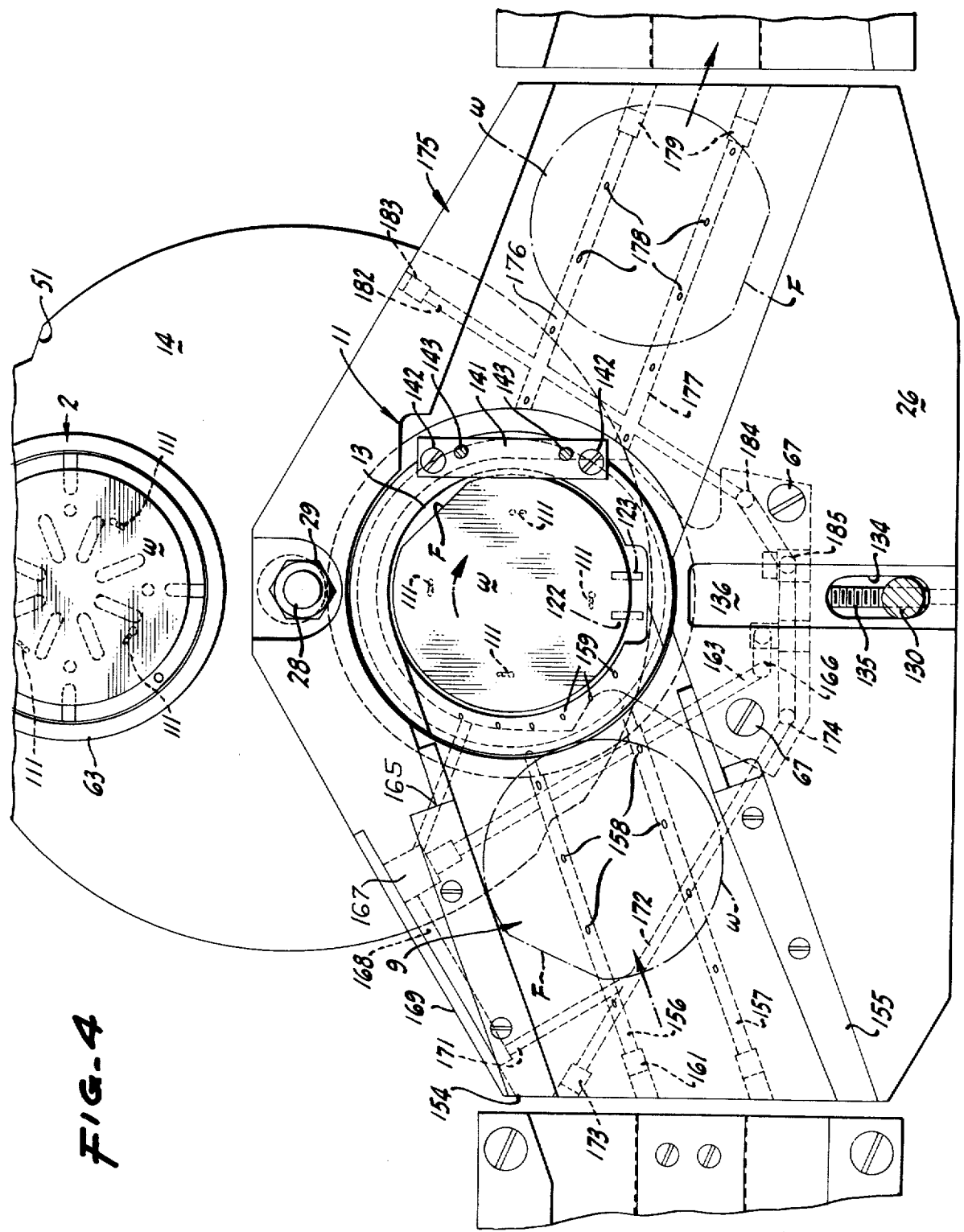

INVENTORS
CECIL A. LASCH, JR.
LASZLO SIPOS
KARL URSPRUNG

BY Flehr, Hohbach, Test,
Albritton & Herbert
ATTORNEYS

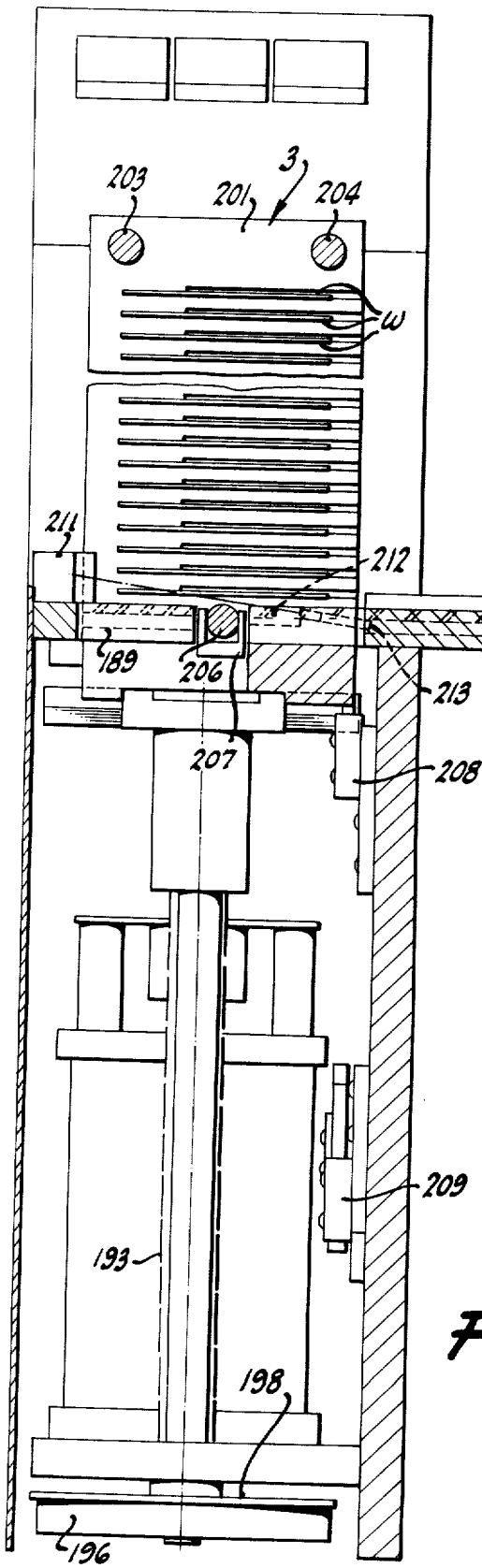
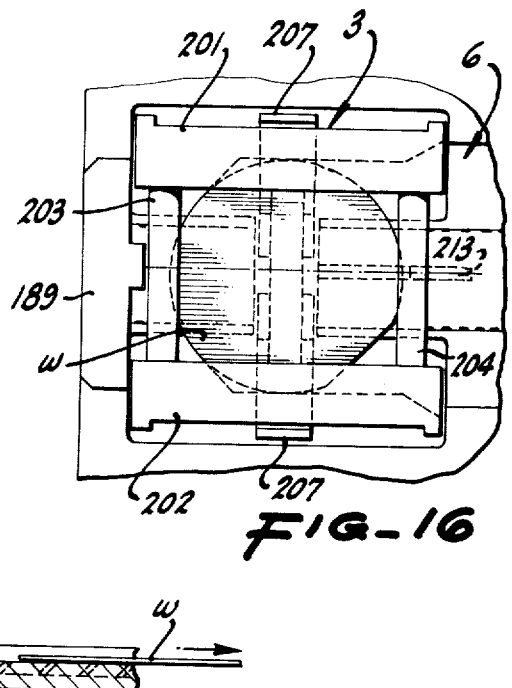
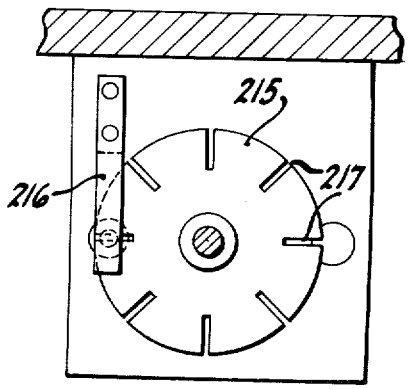

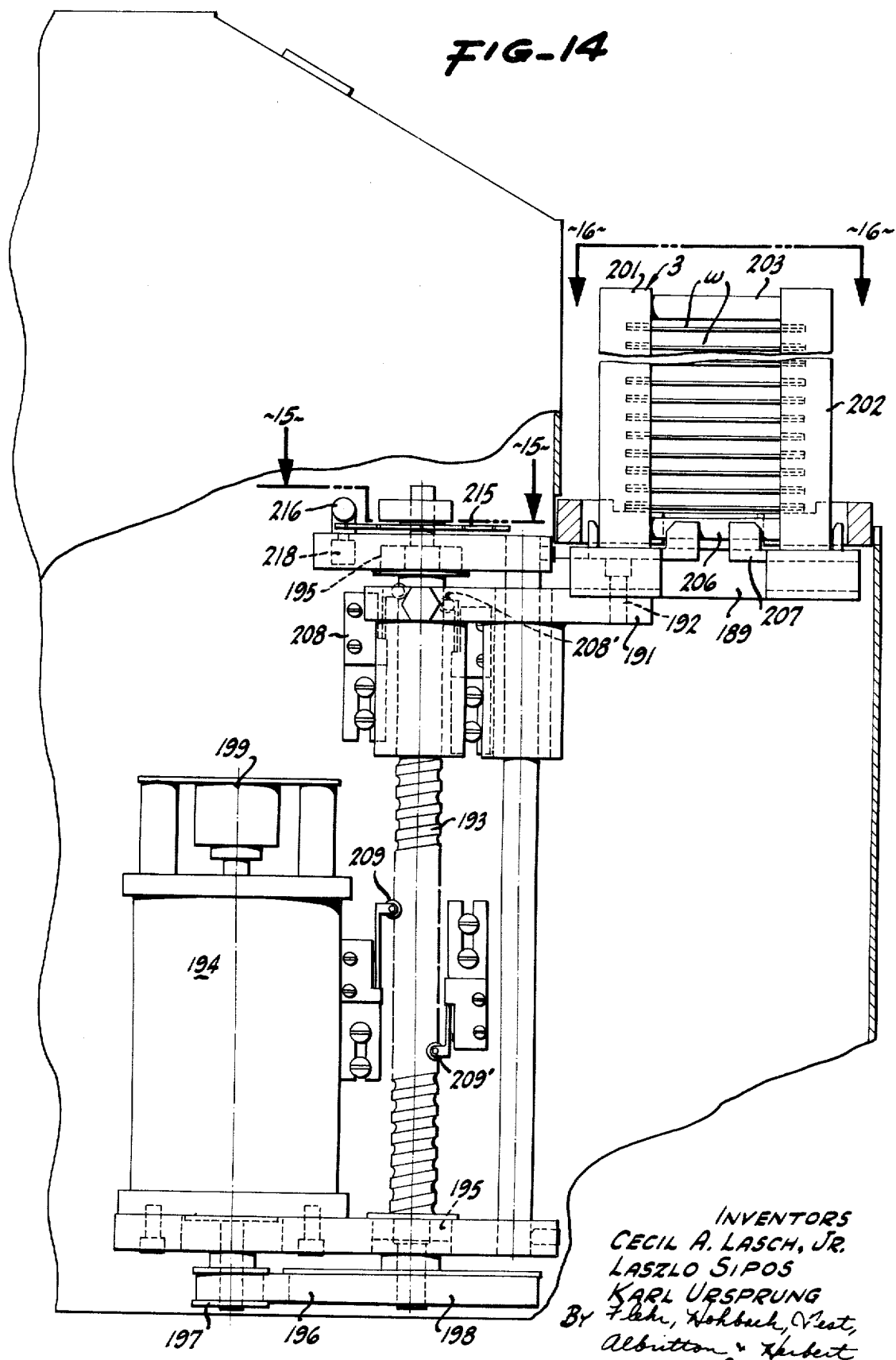

AUTOMATIC WAFER FEEDING AND PRE-ALIGNMENT APPARATUS AND METHOD

CROSS-REFERENCE TO RELATED APPLICATION

This is a continuation, of application Ser. No. 155,499 filed June 22, 1971, now abandoned.

In Lasch, Jr., et al. application Ser. No. 779,033, filed Nov. 26, 1968, entitled "Apparatus And Method For Handling And Treating Articles", now Pat. No. 3,645,581 dated Feb. 29, 1972, improved fluid bearing structures are disclosed in conjunction with improved article outfeed and infeed apparatus and methods. While the present invention is directed to a specifically different aspect involved in the manufacture of semiconductor devices dealing with the handling and treating of silicon and like wafers, said aforementioned application discloses apparatus and method features which are utilizable in conjunction with the subject apparatus and method.

BACKGROUND OF THE INVENTION

1. Field of the Invention

This invention relates to the field of non-manual handling of fragile articles, particularly silicon and like wafers utilized in the manufacture of semiconductor devices in the electronics industry. More particularly, this invention relates to the field of automatic feeding, pre-aligning, mask aligning and exposing silicon wafers during a semiconductor device manufacturing procedure.

Still more particularly, this invention relates to the field of improved means for automatically discharging silicon wafers in sequence from a supply magazine, automatically prealigning the same prior to introducing the same to a treating station, such as a mask aligner, followed by automatic discharge of the treated wafers to a wafer receiving station.

In its broader aspects, this invention relates to means and procedures for non-manual handling of articles of various types, particularly flat fragile articles, and for performing orientation functions on such articles in sequence, such as by locating a flat edge of each such article in predetermined orientation in accordance with a predetermined plan.

In its more specific aspects, this invention relates to the field of improved fluid bearing handling and preorientation systems and procedures for silicon and like wafers utilized in the electronics industry in the manufacture of integrated circuits, transistors and like semiconductor devices.

2 Description of the Prior Art

In the electronics industry, apparatus and procedures for manufacturing semiconductor devices which utilize a series of steps involving depositing or diffusing layers of materials on or into silicon or like wafers is well known. Following such diffusion or deposit, selective areas of the diffused or deposited material are removed by well known processes in a series of steps to produce large numbers of semiconductor devices from a single treated wafer. Such procedures utilize well known mask alignment steps which photographically print a pattern from a mask of predetermined design onto a previously photoresist coated wafer. The steps of photoresist coating and mask aligning are generally well known in the art and various mask alignment apparatus and methods are known and commercially available at the present time. Characteristic of such mask alignment apparatus and wafer handling procedures in mask aligning methods are the apparatus and procedure illustrated in Tancredi U.S. Pat. Nos. 3,521,953 and 3,521,955, both dated July 28, 1970.

The mask alignment apparatus and procedures illustrated and disclosed in said Tancredi patents include a pre-alignment procedure by means of which silicon wafers to be mask aligned are preliminarily oriented so that the flat edge commonly provided on such wafers to assist in pre-alignment thereof is located in a particular position. However, with procedures of the type illustrated in said Tancredi patents, and in other known pre-alignment procedures, pre-alignment is effected substantially entirely manually by the operator. That is, wafers to be pre-aligned and subsequently mask aligned are handled manually.

With such prior known pre-alignment and mask aligning apparatus and procedures, of the type of which the Tancredi patents are illustrative, time consuming and delicate manual operations are required which necessitate the utilization of trained personnel.

The apparatus and method of this invention has been specially designed to obviate the need for manual handling of wafers during feeding of the same into a pre-alignment station, during pre-alignment thereof, and during subsequent mask alignment and discharge thereof from the mask alignment station. That is, with the present invention a fully wafer automatic feeding and pre-aligning system is provided which virtually eliminates all manual operations in conjunction with mask alignment of wafers in the production of semiconductor devices. In that regard, the only manual operation required is the loading of wafer carrying magazines at a sender or feed station and the unloading of wafer carrying discharge magazines at a discharge or receiver station. In other respects, the apparatus and method of this invention is fully automatic with respect to feeding, pre-alignment and discharging from a mask aligner apparatus.

Depending upon the type of mask aligner apparatus with which the subject feeding and pre-alignment system is utilized, some manual checking or manipulation during the actual mask aligning operation may be employed. However, alternatively, the subject invention may be utilized with automatic mask aligning procedures which, when utilized, completely obviate the need for any manual handling even during mask alignment, so that a fully automated system is produced once a supply of silicon wafers is positioned in a carrier at a sender station.

While this invention has particular utility in conjunction with the handling and pre-alignment of fragile articles such as silicon wafers, it should be understood also that its utility in other related areas also is contemplated and should be included within the scope of the inventive concepts disclosed herein.

The numerous advantageous features of this invention are incorporated into a compact apparatus which is readily adaptable for use in combination with known mask alignment apparatus and systems such as those characterized by the Tancredi patents noted above. So far as is known, the improved wafer handling and pre-alignment system and procedure disclosed herein is novel

SUMMARY OF THE INVENTION

The present invention relates to an apparatus and method for handling and treating articles. More particularly, the invention as specifically disclosed herein relates to an improved apparatus and method for outfeeding fragile articles from a sender station, transporting and automatically orienting the articles in a predetermined orientation at a pre-alignment station, following which the same are treated at an adjacent station, following which the treated articles are automatically discharged to a receiving station, all such action being carried on sequentially and automatically in a substantially continous operation requiring minimal operator attention and no manual handling.

Still more particularly, this invention relates to an apparatus and method in which fragile articles, specifically silicon or like wafers, are automatically handled, pre-aligned and fed into a mask alignment apparatus of any suitable construction, following which the mask aligned wafers are automatically discharged from the mask aligner and introduced to a discharge station for subsequent known treating in the manufacture of semiconductor devices.

In the apparatus and method illustrated and described herein, the various novel aspects thereof are incorporated into a single machine capable of handling wafers of varying sizes without requiring substantial adjustments or modifications of the components thereof and such apparatus and method are capable of handling wafers of conventional sizes ranging, for example, from 1 inch to 3 inches in diameter which are the sizes commonly utilized in today's industry.

More specifically, this invention relates to improved outfeed mechanism for sequentially withdrawing wafers automatically from a supply magazine at a sender station, means for transferring the wafer in sequence on a fluid bearing to an improved pre-alignment station in which the wafers are handled automatically prior to introduction thereof automatically into a mask alignment apparatus, following which the mask aligned wafers are automatically discharged onto other means for transferring the same on a fluid bearing into an improved discharge magazine positioned at a receiver station. The supply magazine and discharge magazine are indexed automatically in accordance with the quantity and arrangement of wafers to be outfed or infed thereinto.

At the pre-alignment station, the wafers are oriented entirely automatically using an improved air bearing pre-alignment procedure and optical reader device which orients the flat edge on each wafer in a predetermined location and maintains such orientation while the wafer is being transferred into the mask alignment apparatus. The air bearing used for effecting such pre-alignment pulses each wafer while the same is being rotationally moved under the effects of directional air jets applied thereagainst. All feeding of wafers in sequence into the pre-alignment apparatus, handling thereof in such apparatus, and discharge thereof from the apparatus is effected non-manually utilizing a fluid source as the movant power.

From the foregoing, it should be understood that objects of this invention include: the provision of an improved wafer feeding and pre-alignment apparatus and method; the provision of improved and automatic means for pre-aligning and preorienting wafers or like articles at a pre-alignment station; the provision of improved fluid bearing means and handling method for effecting pre-alignment of wafers prior to mask alignment thereof; the provision of improved wafer supply and discharge magazine indexing apparatus and procedures utilizable in conjunction with a substantially continuous and automatic wafer pre-alignment apparatus and method; and the provision of improved apparatus for outfeeding, pre-aligning and feeding pre-aligned wafers into a mask alignment apparatus, following which the same are automatically discharged on improved fluid bearing means following mask alignment thereof.

These and other objects of the combination and various subcombinations of novel features disclosed herein will become apparent from a study of the following detailed disclosure in which reference is directed to the attached drawings.

DESCRIPTION OF THE DRAWINGS

FIG. 1 is a plan view of the subject apparatus shown in position with a known mask aligner.

FIG. 2 is a vertical sectional view through the apparatus taken in the plane of line 2—2 of FIG. 1.

FIG. 3 is a vertical sectional view through a portion of the apparatus shown in FIG. 2 on an enlarged scale relative thereto.

FIG. 4 is a partial horizontal sectional view through a portion of the apparatus illustrating details of the pre-align structure thereof taken in the plane of line 4—4 of FIG. 2.

FIG. 13 is a vertical sectional view through the sender section of the apparatus taken in the plane of line 13—13 of FIG. 1.

FIG. 14 is a vertical sectional view through the sender section of the apparatus taken on the plane of line 14—14 of FIG. 1.

FIG. 15 is a horizontal sectional view through the sender section of the apparatus taken in the plane of line 15—15 of FIG. 14 illustrating details of a counting mechanism employed thereat.

FIG. 16 is a plan view of a portion of a supply magazine of the apparatus taken in the plane of line 16—16 of FIG. 14.

DESCRIPTION OF THE PREFERRED EMBODIMENT

Figure 5:
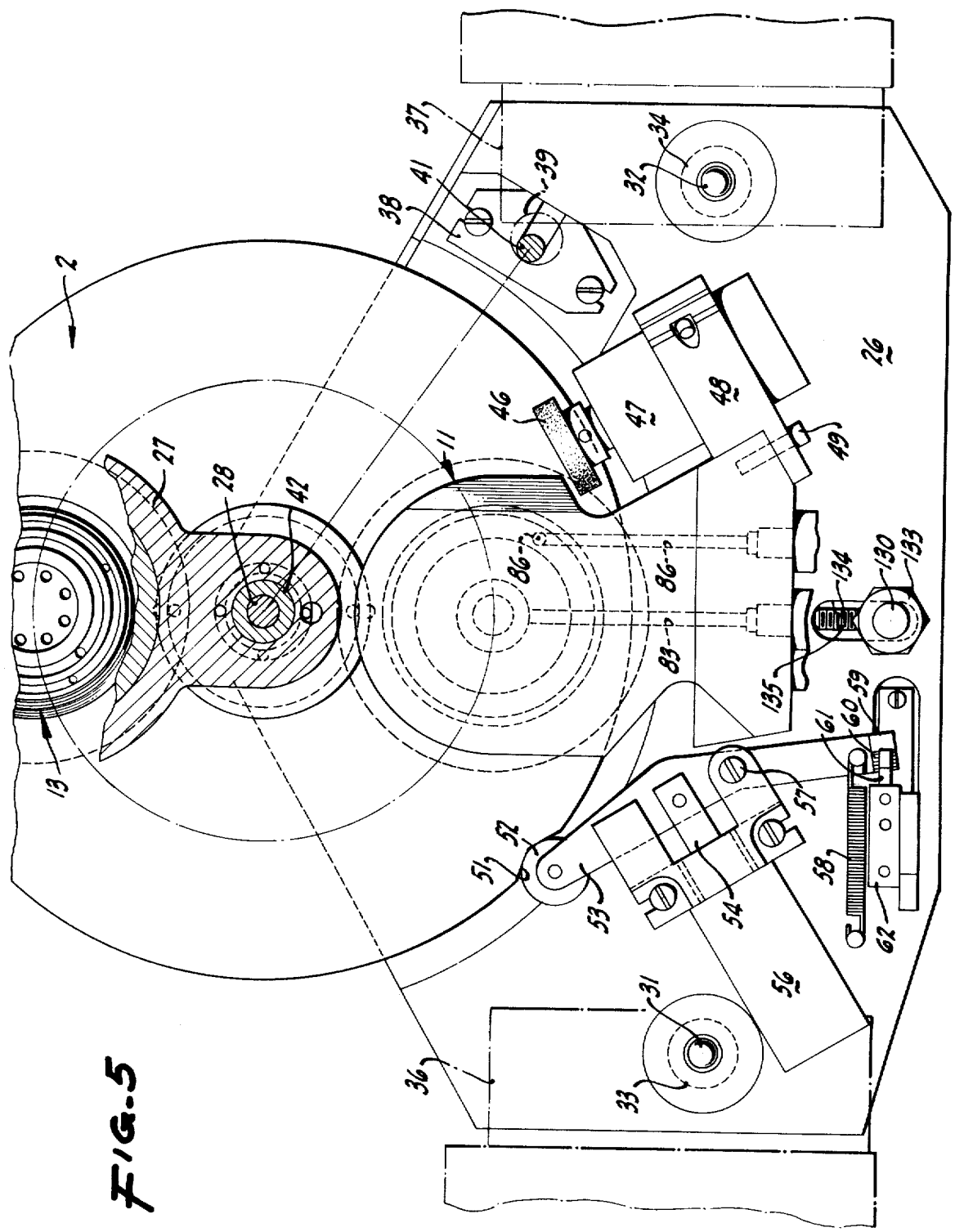
FIG. 5 is a partial horizontal sectional view looking upwardly from beneath the pre-align section of the apparatus taken in the plane of line 5—5 of FIG. 2.

As noted previously, the apparatus and method of this invention are disclosed herein with particular reference to the automatic handling, transporting and pre-alignment of thin fragile silicon and like wafers of the type widely used in the electronics industry. However, it should be understood that the novel combination and subcombination features disclosed herein have applicability to other fields in which articles analogous to semiconductor wafers require alignment or orientation prior to subsequent treating thereof.

It should also be understood that the various features of this invention, while highly effective when combined to provide an integrated apparatus such as the automatic wafer feeding and pre-alignment apparatus disclosed herein, have applicability independently of each other in the feeding, handling and pre-alignment or other treatment of silicon and like wafers or analogous devices.

SUMMARY OF OPERATION

Referring first to the showing of FIG. 1, the sequence of handling a series of wafers in conjunction with mask alignment of the same for subsequent use and transformation into semiconductor devices will be described. In that regard, the apparatus and procedure for feeding, handling and pre-aligning wafers is shown in FIG. 1 in conjunction with a known mask aligner designated by the dotted outline in such figure and generally identified by reference manual 1. Such mask aligner may take any known form and in the embodiment of the present invention disclosed herein such mask aligner is of the type illustrated and described in Tancredi U.S. Pat. Nos. 3,521,953 and 3,521,955 referred to previously, and marketed commercially by Kulicke and Soffa Industries, Inc. of Fort Washington, Pennsylvania and identified as its Model 686 mask aligner.

It is the purpose of the present invention to present wafers (each designated W in the drawings) to a fine alignment station at which a mask is applied to the wafers in sequence and the same are subsequently exposed to ultra-violet or like light in known fashion. Such mask alignment station is generally designated 2 in FIG. 1. Because the details of mask alignment and the procedures and purposes thereof are well known in the art, such details are not set out herein. However, reference is directed to said Tancredi patents for a more detailed discussion of such purpose and the function thereof.

Still referring to FIG. 1, a quantity of wafers, numbering twenty five or more, which have been previously positioned in a supply magazine 3 are located at sender station 4 at one end of the apparatus. The supply magazine is indexable vertically downwardly by indexing means to be described so that the lowermost wafers may be withdrawn in sequence and placed on transfer means which, in the embodiment illustrated, comprises a fluid bearing track structure generally designated 6. Such track structure supports and carries individual wafers on an air or like gas bearing from the sender station into the pre-alignment center structure of the apparatus, generally designated 7. Such pre-alignment structure includes an extension of the transfer means in the form of a fluid bearing track section 8 which defines a buffer station generally designated 9 at one side of a pre-alignment station, generally designated 11.

The pre-alignment station is provided generally centrally of the pre-alignment structure and it is to such station that individual wafers are fed in sequence while the same are rotated in a horizontal plane by rotational means to be described.

The edge of each wafer is positioned in underlying relationship relative to a reader or electrical sensor 12 which partially overlies the pre-alignment station. The function of the reader 12 is to determine when the flat or straight edge portion of the wafer is in a pre-determined position. When such predetermined orientation is effected, the reader transmits a signal which effects dis-continuation of further rotation of the wafer and the same is thereafter held in such orientation by vacuum on a chuck member 13 positioned at the pre-alignment station on which the wafer is rotationally oriented at the pre-alignment station.

Following pre-alignment, each wafer is rotated with its supporting chuck 13 on a turntable 14 to the mask alignment station 2 mentioned previously. From FIG. 1 it will be noted that each wafer W when in the mask alignment position has its flat or straight edge F oriented in accordance with the prealignment position imparted thereto at the pre-alignment station 11. When a wafer is at the mask alignment station, the operator performs the mask aligning and exposure functions thereon mentioned previously. When such mask alignment and exposure functions are completed, each mask aligned and exposed wafer is again transferred on turntable 14 back to the pre-alignment station 11.

In conjunction with such transfer, a suceeding wafer which was being pre-aligned while the preceding wafer was being mask aligned, is transferred to the mask alignment station 2. In that regard, while two operating positions are shown on the turntable 14, it should be understood that less than two or more than two positions may be employed without departing from the spirit or scope of this invention.

In conjunction with movement of a mask aligned and exposed wafer from the mask alignment station back to the pre-alignment station, the supply magazine 3 is indexed to feed another wafer to the buffer zone 9. However, such wafer cannot enter the pre-alignment station until a previously exposed wafer is discharged therefrom. Such discharge of an exposed wafer is controlled by a solenoid mechanism generally designated 16 which actuates a stop control ring 17 positioned at and outlining the pre-alignment station. When the solenoid mechanism is actuated, the previously exposed wafer at the mask alignment station is released onto another section of transfer fluid bearing track 18 and thereafter the wafer previously held in the buffer zone 9 is inserted into the pre-alignment station for pre-alignment therein.

The exposed wafer discharged from the pre-alignment station is positioned by the fluid bearing track section 18 onto another transfer means defined by another fluid bearing track section 19 for transfer thereby into a discharge magazine 21 at a receiver station generally designated 22. In that regard, the discharge magazine 21 is sequentially indexed upwardly in response to insertion of each mask aligned and exposed wafer thereinto so that the discharge magazine is at all times ready to receive another wafer therein.

In that regard, improved sensing means for controlling the indexing of both the supply magazine and the discharge magazine are provided in conjunction therewith, as will be described.

It should be understood further that the fluid bearing track sections 8 and 18 on opposite sides of the pre-alignment station are movable in conjunction with the entire pre-alignment center section of the subject apparatus to permit the operator of the mask aligner to accurately orient a wafer positioned at the mask alignment station in accordance with known procedures. However, the track structures 6 and 19 are fixed relative to the remainder of the apparatus for receiving wafers from the supply magazine 3 and for inserting wafers into the discharge magazine 21 is described.

It should be understood that the pre-alignment structure is mounted for movement as noted previously to permit accurate mask alignment at the pre-alignment station 2 in known fashion. In that regard, the turntable 14, the reader 12, the solenoid structure 16, and the fluid bearing track sections which defines the buffer section 9 and the discharge section 18 all are movable and are supportable upon a central supporting structure generally designated 23 in FIG. 1 which is manually adjustable by the operator of the mask aligner in known fashion as described in greater detail in the aforementioned Tancredi patents.

It should also be understood from the foregoing summary that the apparatus and method of handling and pre-aligning wafers disclosed is essentially continuous and requires no manual handling of wafers. The only operator attention required is the inserting of a supply magazine carrying wafers at the sending station and the removal of the discharge magazines when filled from the receiver station, and the substitution of subsequent filled and empty magazine at such respective stations. A more detailed description of the sequence of operation of the subject apparatus will be set out herein after following a description of the various operative components of the apparatus.

PRE-ALIGNMENT APPARATUS AND PROCEDURE

Before discussing the construction, function and operation of the components of the sender and receiver stations, and the transfer means utilized in conjunction therewith for introducing wafers into and transporting wafers away from the pre-alignment section of the apparatus, such pre-alignment section will first be considered.

Referring first to FIG. 4, it will be noted that the pre-alignment section and station include a pre-align supporting plate 26 which is generally trapezoidal in contour when viewed from above. The pre-align supporting plate, referring to FIG. 5, and other components of the pre-alignment apparatus supported thereby, in turn is supported for adjustable movement during fine alignment of wafers at the mask aligning station in the manner described in the aforementioned Tancredi patents. Such adjustable movement is effected by known operator actuated means (not shown) operatively connected with a mask alignment work station casting 27 which forms part of the known mask aligner apparatus as exemplified by reference numeral 11 in said Tancredi patents. Such work station casting 27 is movable within predetermined limits during fine alignment of a wafer at the mask aligner station in known fashion as discussed in said Tancredi patents.

The pre-align plate 26 is secured for movement with the work station casting 27 by means of a vertical mounting shaft 28 (note FIGS. 2 and 4) which extend through the respective pre-align plate 26 and work station casting 27 and is held in place thereon by a nut member 29 threaded to the upper end of the shaft as noted in FIG. 2.

Still referring to FIG. 5, the opposed lateral margins of the pre-align plate 26 are supported for movement in substantially all directions by opposed ball supporting members 31 and 32 received within fittings 33 and 34 respectively secured to the pre-align plate (also note FIG. 2 in that regard). Such ball members are supported upon and ride over mounting brackets 36 and 37 secured to and projecting laterally from the main mask aligner apparatus in any suitable fashion, such as by bolting or welding, in the manner seen in FIGS. 1 and 5. Thus, upon movement of the mask aligner casting 27 under control of the mask aligner operator in known fashion, the pre-align plate 26 and all components mounted thereon move with the mask aligner casting while wafers are being pre-aligned at the pre-align station.

As noted from FIG. 5, an adjustable mounting bracket 38 is held by screw fasteners or like means to the underside of the pre-align plate. Such bracket includes a slot 39 and an eccentric adjustable pin 41 extending into said slot. Upon rotation of the pin, when the pre-align and mask aligner apparatus are first being installed for use in conjunction with wafers of a particular size, proper interrelationship and adjustment between the work station casting 27 and the pre-align plate 26 may be effected.

TURNTABLE CONSTRUCTION AND OPERATION

The aforementioned rotatable turntable 14, as seen from FIGS. 4 and 5, is positioned to rotate between the mask align station 2 and the pre-alignment station 11 about the axis of the aforementioned fixed shaft 28. Such rotation is effected via a hollow mounting column 42 (note FIGS. 2 and 5) which is rotatable about the shaft 28. In that regard, as seen in FIG. 3, the hollow column 42 includes a shoulder 43 adjacent its upper end upon which the center of the turntable rests. An upper separable shoulder 44 is clamped in place to the top of the turntable by the aforementioned nut 29. Thus, upon rotation of the turntable in the manner to be described, column 42 rotates therewith about the axis of shaft 28.

Referring to FIG. 5, means for rotating the turntable in selective predetermined fashion between the pre-align and mask align stations is defined by a friction wheel 46 formed of suitable rubber of plastic material which engages the underside of the turntable. The friction wheel is actuated by a standard direct current electric motor and gear box assembly 47, such assembly being secured in operative position by a motor mounting bracket 48 fastened by screws 49 to a portion of the piston assembly to be described hereinafter.

It will be understood that upon actuation of motor 47 the friction wheel will drive the turntable in either clockwise or counterclockwise direction as may be preferred. In that regard, proper and automatic positioning of the turntable at the pre-align and mask align positions is an important feature of the subject apparatus. In that regard, as seen from FIGS. 4 and 5, the turntable is provided with diametrically opposed generally V-shaped notches 51 provided to selectively receive therein a positioning roller 52 rotatably mounted on one end of a pivotal arm 53 which in turn is pivotally connected intermediate its ends to a mechanism for pivoting the same in the form of a control arm 54 of a solenoid 56 adjustably secured by screw fasteners to the pre-align plate 26. The pivotal arm 53 is mounted for pivotal movement about the axis of a pivot pin 57 secured to the pre-align plate 26 as noted in FIG. 5.

Adjacent its end opposite roller 52, pivotal arm 53 is engaged with a coil spring 58 which normally urges the positioning roller 52 into engagement with the peripheral edge of the turntable. The spring is mounted between suitable pins connected to the pre-align table 26 and the arm 53 as seen in FIG. 5.

Located outwardly of spring 58 at its outer end 59, arm 53 is provided with a switch-trip projection 60 which is selectively engageable with the actuator 61 of a micro-switch 62 secured to the pre-align plate. Such micro-switch controls operation of motor 47 which drives friction wheel 46.

When solenoid 56 is actuated, the control arm 54 thereof is drawn into the solenoid to effect pivoting of arm 53 about its pivot pin 57. Such movement actuates the micro-switch and the positioning roller is simultaneously withdrawn from engagement with the notch 51. Actuation of the solenoid is effected for only a brief period of time, such as 1/10th of a second, sufficient to retract the roller from the notch. Thereafter, the solenoid is deactivated, permitting spring 58 to return the positioning roller into engagement with the circular periphery of the turntable. Such engagement continues as the friction wheel 46 rotates the turntable in response to continued actuation of motor 47 in response to continued actuation of micro-switch 62 due to engagement of the actuator thereof with projection 60 on the outer end of arm 53.

Such rotation of the turntable continues until positioning roller 52 is urged by spring 58 into the other notch 51 opposite from that shown in the initial position of FIG. 5. Upon the roller being let into the other notch, the actuator 61 of the switch 62 is disengaged, thereby deactivating the switch and stopping motor 47. In that regard, motor 47 is of the commercially available type which includes the ability to have the voltage thereof reversed upon receipt of a control signal. Such voltage reversal, in known fashion, produces a dynamic brake which results in prompt stopping of the friction wheel almost simultaneously with positioning roller 52 entering the other notch 51. Thus, the turntable is accurately positioned after 180° rotation thereof.

In that connection, it should be understood of course that the number of operative positions of the turntable and the amount of rotation thereof between such positions, may be varied to meet particular needs. In the present embodiment, only two opposed stations, the pre-align and mask align stations, are provided as noted, thereby dictating the 180° rotational relationship described.

WAFER SUPPORT STRUCTURE

As noted in FIG. 2, the turntable is provided with two diametrically opposed openings 62, each of which is provided to receive a chuck member 13 as previously identified. In general, the configuration of such chuck member, as seen in FIG. 3, corresponds generally to commercially available chuck constructions of the type illustrated in FIG. 10 of the aforementioned Tancredi patents, and such chuck performs the same basic purpose as the chuck in such patents. However, as noted hereinafter, each chuck used with this invention is specially modified to meet the needs of this invention.

Each chuck member is removably received within a turntable opening 62 and each includes a series of blind passages therethrough in the manner and for the purpose to be described. Surrounding the chuck member is a rubber or like seal 63 which is generally z-shaped in cross-section as seen in FIG. 3. The purpose of the chuck member is to provide a supporting surface for a wafer during pre-alignment and mask alignment and exposure of the water to light during mask alignment.

As will be discussed hereinafter, means are provided at both the pre-alignment station and the mask alignment station for selectively elevating a chuck member positioned thereat to present a wafer to the appropriate apparatus positioned at said stations. In that connection, it should be understood that wafers are of generally high reflectivity characteristics and to impart the chuck member which carries a wafer with reflectivity differential characteristics, each chuck member preverably is produced from or coated with a material which has comparatively low reflectivity. As a result, when the reader 12 is activated at the prealignment station, the differential reflectivities of the wafer and the chuck member are recognizable to permit prealignment in the manner to be described.

As noted from FIG. 2 taken in conjunction with FIG. 4, the aforementioned pre-align plate 26 has a separate plenum section 66 secured to the underside thereof by screw fasteners 67 or equivalent means. Such plenum section, referring to FIGS. 2, 3, and 7, includes a generally hollow central chamber 68 having a boss 69 projecting upwardly centrally thereof. Boss 69 has a bore 71, extending therethrough in which is received a movable piston 72, such piston being extensible and retractable between the relative positions shown in FIGS. 3 and 7. At its lower end, piston 72 is provided and a stop projection 73 which prevents the piston from bottoming completely on the bottom of bore 71 when the piston is in the retracted position.

Vertical movement of the piston in bore 71 is controlled within the limits defined by the stop 73 contacting the base of bore 71 and a shoulder 74 provided on a laterally extending inverted cup shaped extension 76 of the piston contacting a removable shoulder 77 threadedly engaged with an upper portion of the plenum section 66. It should be understood that the cup shaped extension 76 of the piston travels vertically in and the annular shoulder 74 thereof contacts the side walls of the hollow chamber 68 during such travel. Where required, suitable seals, designated S, are provided between the piston and surfaces contacting the same in the manner seen in FIGS. 3 and 7.

Figure 7:
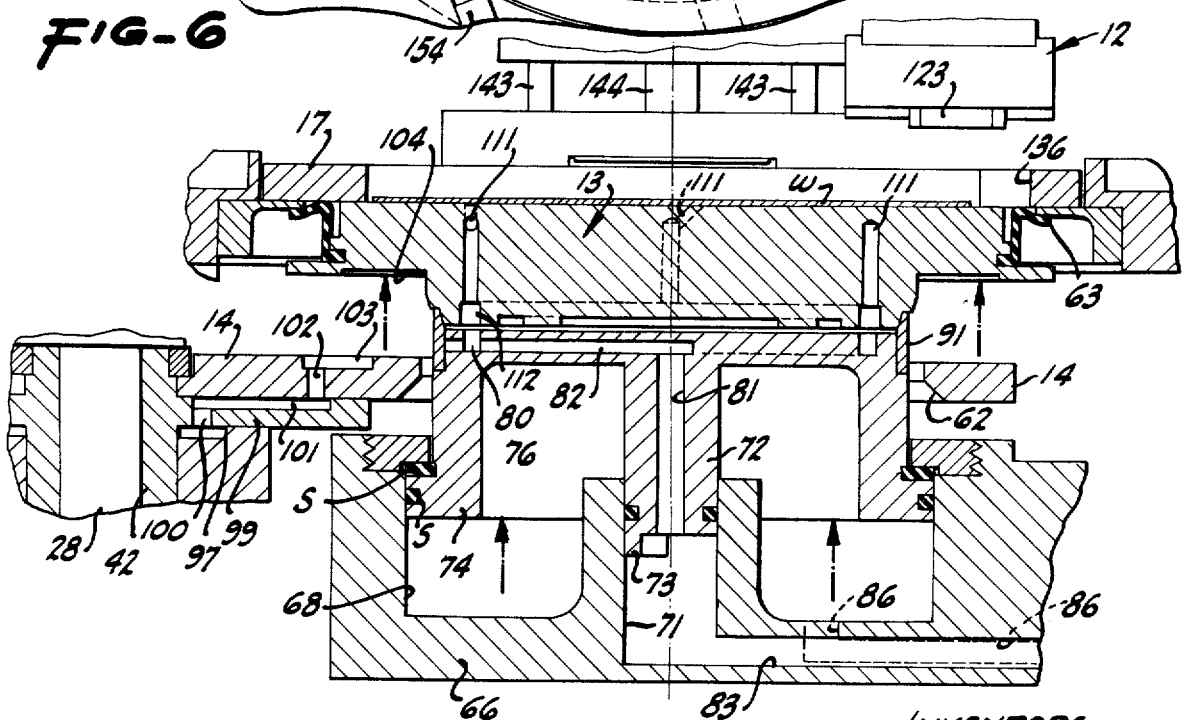
FIG. 7 is a vertical sectional view through the structure of FIG. 6 taken in the plane of line 7—7 of that figure.

Piston 72 includes a fluid passage 81 extending axially thereof and a lateral fluid passage 82 in communication therewith. An annular groove 80 communicates with passage 81 and extends around and opens to the top of the plenum section as seen in FIGS. 3 and 7. Bore 71 and fluid passages 80, 81 and 82 are alternately connected through the plenum section via a fluid passage 83 to any suitable sources of air under pressure and vacuum as best seen in FIG. 2. In that connection, it should be understood that the respective pressure and vacuum sources are positioned side by side in FIG. 2 and are in selective communication with the passage 83 under predetermined conditions to be described. In that regard, the air pressure source is designated 84 in FIG. 2 and it should be understood that a similar source of vacuum is positioned behind the pressure source 84 and is therefor not visible in FIG. 2. However, the purpose of such alternate pressure and vacuum sources operable through piston 72 is to alternately apply pressure and vacuum to the chuck member 13 under predetermined conditions when the piston is in its elevated position.

In that latter regard, referring to FIG. 3, tt should be noted that the hollow chamber 68 within which the inverted cup portion 76 of the piston is movable is connected by a fluid passage designated 86 whereby air under pressure or vacuum may be selectively introduced into the chamber 68 to elevate the piston or to effect positive retraction of the piston. The passage 86 is connected with any suitable air and vacuum sources in known fashion.

Thus, the piston may be selectively elevated or retracted in predetermined sequences as desired.

It should further be noted from FIGS. 3 and 7 that the cup shaped extension 76 of the piston is surmounted by a circular guide ring 91 which projects above the upper surface thereof. Such guide ring is internally tapered and provides a seat for the lower tapered portion of the chuck member to be engaged therewith when the piston is elevated to the position seen in FIG. 7. Comparing FIG. 3 with FIG. 7, it will be noted that elevation of the piston raises the chuck member from engagement with the turntable 14 under predetermined conditions.

In that regard, the position of the piston and chuck during pre-alignment of a wafer are as shown in FIG. 7 so that the wafer to be pre-aligned is positioned adjacent the pre-alignment reader 12. when the position is retracted to the position shown in FIG. 3, the chuck member is in engagement with and supported by the upper surface of the turntable and is held in such position, as is the wafer thereon following pre-alignment thereof, for rotation of the pre-aligned wafer to the mask alignment station.

In that regard, referring to FIG. 2, to preclude misalignment of a previously pre-aligned wafer during transfer thereof to the mask alignment station by rotation of the turntable, vacuum means is provided for holding the chuck and the wafer thereon in position during such turntable rotation. Such vacuum means comprises a vacuum port connection 96 (FIG. 2) which comminicates with a passage 97 through a cylinder 98 which surrounds the aforementioned column 42. Cylinder 98 is connected with and forms part of the mask alignment casting 27 mentioned previously, and both form part of a mask aligner apparatus exemplified by the aforementioned Tancredi patents.

At its upper end the cylinder is surmounted by a sealing plate 99 having an opening 100 therethrough in communication with the upper end of the passage 97 as seen in FIGS. 3 and 7. The plate 98 has a peripheral groove 101 is its upper surface which communicates with one or more passages 102 extending vertically through the turntable and communicating with one or more recesses 103 formed in the top of the turntable adjacent the center thereof. Thus, referring to FIG. 3, when piston 72 is retracted and the chuck is positioned upon the turntable the chuck may be subjected to the effects of vacuum passing through the aligned passages 97, 100, 101, 102 and 103 to hold the chuck in position against rotation relative to the turntable.

Still referring to FIG. 3, it will be noted that the chuck has a peripheral groove 104 in the base thereof which is in communication with a series of passages 106 extending upwardly through to the top surface thereof. Thus, when the chuck is in the down position resting upon the turntable and vacuum is introduced into groove 104, vacuum atmosphere is presented to the wafer W supported on the chuck and such wafer is positively held against rotation or movement while the chuck is moved with the rotating turntable 14 from the pre-align station to the mask align station. It should further be noted from FIG. 3 that sufficient clearance exists between the base of the chuck and the turntable and the guide ring 91 of piston 72 to prevent any interference with rotation of the turntable between the respective stations noted.

Under normal operating conditions, vacuum will be continuously applied to the turntable in the manner noted from any suitable source and the effect of such vacuum will be selectively overcome by the pressure applied to piston 72 periodically raise the same. Thus, there is no need to correlate vacuum introduction to the turntable with raising or lowering of the piston although such correlation could be affected if desired.

WAFER ROTATION DURING PRE-ALIGNMENT

Pre-alignment of a wafer at the pre-alignment station is effected by rotating the wafer after the same has been introduced into a confining area which permits rotation while precluding lateral translation thereof. In that regard, referring to FIGS. 4, 6, and 7, such confining zone comprises a control ring member 17 against the lower surface of which the wafer supporting chuck 13 is engageable when piston 72 is elevated in the manner seen in FIG. 7. Chuck seal 63 insures air tight interconnection between the control ring and the chuck when the chuck is elevated.

Wafers are introduced in sequence into the control ring in the manner to be described and individual wafers positioned therein are precluded from separation therefrom by engagement with the inner peripheral walls of the control ring. Wafer rotation is effected to bring the flat edge portion F thereof into alignment with the electronic reader 12 positioned at the pre-alignment station and overlying the control ring 17. As noted from FIGS. 6 and 7, chuck 13 is provided with a plurality of directional air jets 111 which project upwardly through the chuck and are in communication with a peripheral groove 112 specially provided in the base of the chuck and oriented to communicate with the aforementioned passages 81 and 82 in the piston 72. Thus, when air is introduced into groove 112 and passes through passages 111 into contact with the wafer supported on the chuck, the directional exit angle of such passages 111 will effect raising and rotation of the wafer in the direction noted by the arrow in FIG. 6. Such rotation will bring the flat edge portion of the wafer beneath the electronic reader for the purposes of aligning and subsequently holding such edge portion in a position of alignment thereon as will be described.

In addition to the angularly oriented passages 111 through the chuck, it will be noted from FIG. 4 that the chuck includes a series of other air passages therethrough which similarly communicate with passages 81 and 82 in the piston and the source of vacuum and pressure in communication therewith. Thus, in conjunction with rotation of the wafer by the directional air passages, alternate pressure and vacuum application is applied to the wafer which results in alternate elevation and retraction of the wafer, and resulting jogging of the wafer to effect rotation thereof in controlled fashion. Alternate vacuum and pressure application is effected through any standard control valve arrangement. As will be described, wafer rotation is effected at varying speeds as the wafer nears its pre-alignment orientation.

PRE-ALIGNMENT READER STRUCTURE

Figure 10:
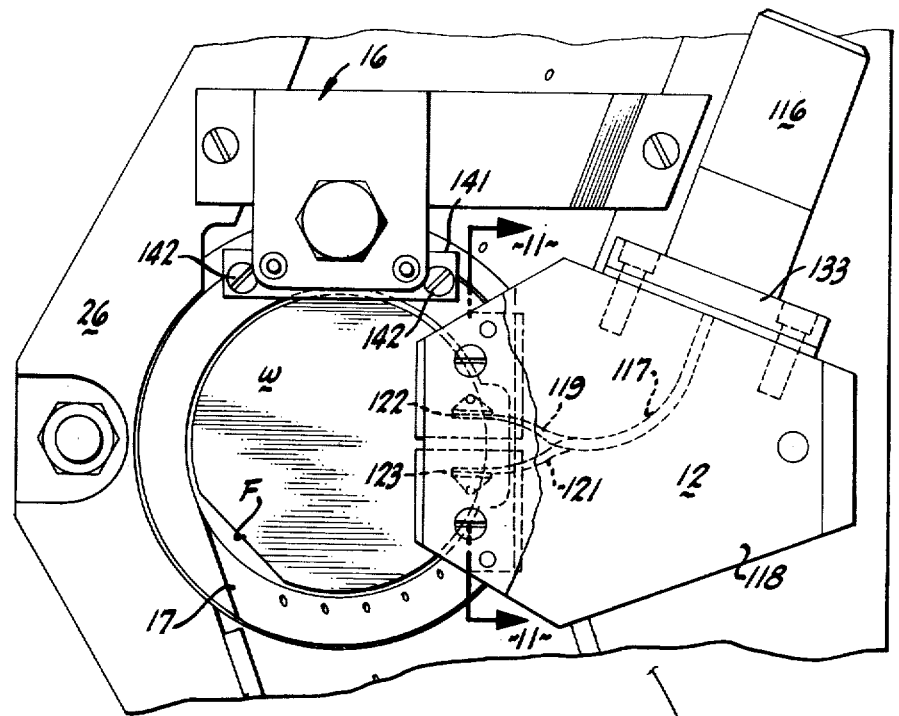
FIG. 10 is a plan view of a portion of the pre-align mechanism of the apparatus, particularly the electrical reader thereof, taken in the plane of line 10—10 of FIG. 2.
Figure 12:
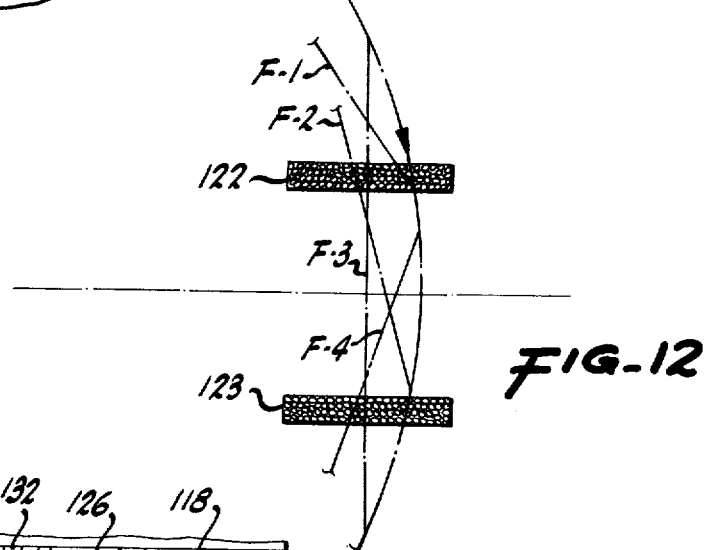
FIG. 12 is a schematic view illustrating the operation of the reader utilized in conjunction with the pre-align mechanism.
Figure 11:
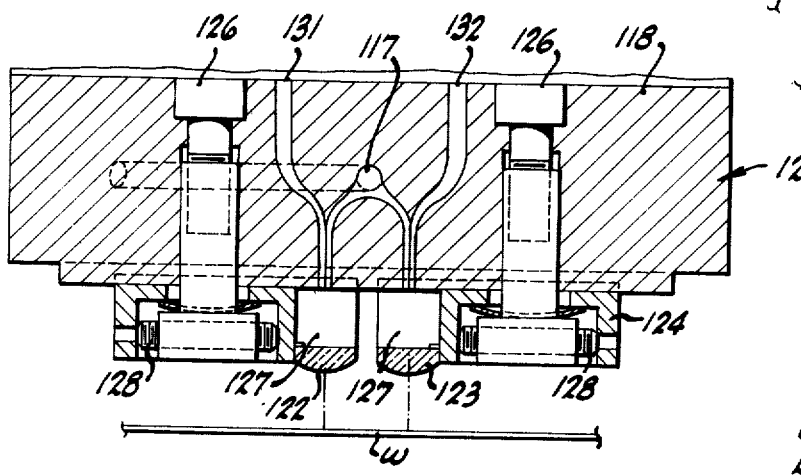
FIG. 11 is a vertical sectional view through the reader taken in the plane of line 11—11 of FIG. 10.

The details of construction of reader 12 are best seen in FIGS. 10 through 12. Such reader includes a light housing 116 connected with any known electrical source to provide a beam of light introduced into a bundle of fiber optics 117 extending from the light housing through a channel provided through the reader block designated 118. The fiber optices are of a type conventionally known and commercially available and are oriented in the housing 118 so that their path is divided at 119 and 121 to direct parallel light signals downwardly in parallel paths through parallel cylindrical lenses 122 and 123. Such lenses are held in place beneath block 118 in a lense mounting bracket 124 secured beneath the block by screw fasteners 126.

It should be noted from FIG. 11 that air spaces 127 are interposed between the ends of the fiber optics bundles and the lenses. The lenses are held in place in the bracket 124 by any suitable means, such as epoxy resin. Set screw constructions 128 are provided to permit lateral adjustment of the respective lenses to accommodate therebeneath wafers of varying size.

As the function of electrical fiber optics sensors is well known, details thereof will not be repeated herein. However, it should be understood that light signals transmitted downwardly from the parallel bundles of fiber optics through the lenses are reflected upwardly through the same lenses and pass through extensions of the fiber optics bundles 131 and 132 for transmitting the control signal to be effected thereby. That is, the light signals are reflected upwardly from the wafer and/or chuck positioned therebeneath in paths generally parallel to the downwardly directed paths of light.

As noted from FIG. 10, preferably an amber filter 133 is interposed between the light housing 116 and the fiber optics bundles to prevent unwanted exposure of the photoresist coating on the wafers by the fiber optics light source.

The reader 12, as seen in FIGS. 2 and 4, is adjustably mounted to permit utilization thereof with wafers of varying sizes. In that regard, an adjustable mounting bolt 130 extends through the pre-align plate structure 26 and is held in place thereon by nut 133. A slot 134 is provided in the plate structure 26 and a set screw 135 is received within the slot and extends through the mounting bolt 130 to permit lateral adjustment of the reader block 118. The reader block in turn includes an elongated projection 136 (FIG. 4) slidable in a recess in the plate structure 26 during such adjustable movement of the reader block.

Referring to the schematic showing of FIG. 12, operation of the reader will be described. In that regard, the flat edge of a wafer as the same is initially rotated beneath the reader first moves to the position F-1 beneath lens 122. The fiber optics bundle passing through that lens senses the different reflectivity of the wafer and the chuck and a control signal will be transmitted in response to such sensing. The effect of such signal will be to decrease the increments of rotation of the wafer by pulsing more rapidly the alternate pressure and vacuum applied to the wafer through the chuck within the control ring. Prior to the wafer flat reaching the F-1 position beneath lens 122, larger incremental rotational movement of the wafer was effected by applying alternate pressure and vacuum to the wafer of greater intensity.

Upon movement of the wafer in the smaller increments noted after the flat has first passed the lens 122, the flat of the wafer continues to move in such small increments until it reaches the position designated by F-2, at which time the flat passes beneath the second lens 123, which then senses the different reflectivities of the wafer and chuck and transmits a control signal indicating the wafer is approaching the proper pre-alignment position.

Such pre-alignment position is designated by the position F-3 of the flat in FIG. 12 at which time the light beam through both lenses 122 and 123 is broken and the optical bundles both sense the differing reflectivities of the wafer and chuck. When in that position, the wafer is in proper pre-alignment and further rotation thereof by air and vacuum pulsing is halted by an appropriate control signal from the reader. Thereafter, vacuum is applied to the chuck and wafer to hold the same in pre-aligned position in the manner described previously so that the chuck can be rotated with the turntable to the mask alignment position.

Still referring to FIG. 12, if a wafer should over-shoot the proper per-alignment position to the orientation shown at F-4, pulsing to produce larger incremental movement will be reinstituted to again rapidly rotate the wafer until the flat again reaches the F-1 position, at which time smaller incremental movement is again initiated.

The reader is an analog type of photoelectric reader which utilizes fiber optics as noted. The single light source input divides the light into two channels through the parallel cylindrical lenses as noted. The two lines of light created by the lenses pass across the edge of the wafer during sensing and the reflected light from the bright surface of the wafer and from the less reflective surface of the chuck are reflected back through the separate fiber optic bundles through the same cylindrical lenses and pass upwardly through the optical bundles 131 and 132 where such reflections are measured and compared by photocells provided thereat in known fashion to produce the noted control signals.

The reader performs various functions, including the measuring of the differences of reflection between the reflective surfaces of the wafer and the chuck which determine the presence of a wafer as it first passes into the control ring area. In response to a preset difference in such reading, the reflections detect the approaching flat at the F-1 position noted and thereafter measure the equality of the two reflective surfaces when the flat reaches the F-3 position of FIG. 12. Furthermore, following mask alignment and exposure of the wafer at the mask alignment station following return thereof to a position beneath the reader permits the reader to sense that the wafer has been exposed so that the same can be passed from the control ring structure 17 to the discharge station. Finally, the reader is capable of recognizing through the spacing of the lenses the difference between the flat edge of a wafer and any small notch or incongruity or other surface discrepancy thereof which is not of sufficient size to lie beneath both beams of light simultaneously.

Figure 6:
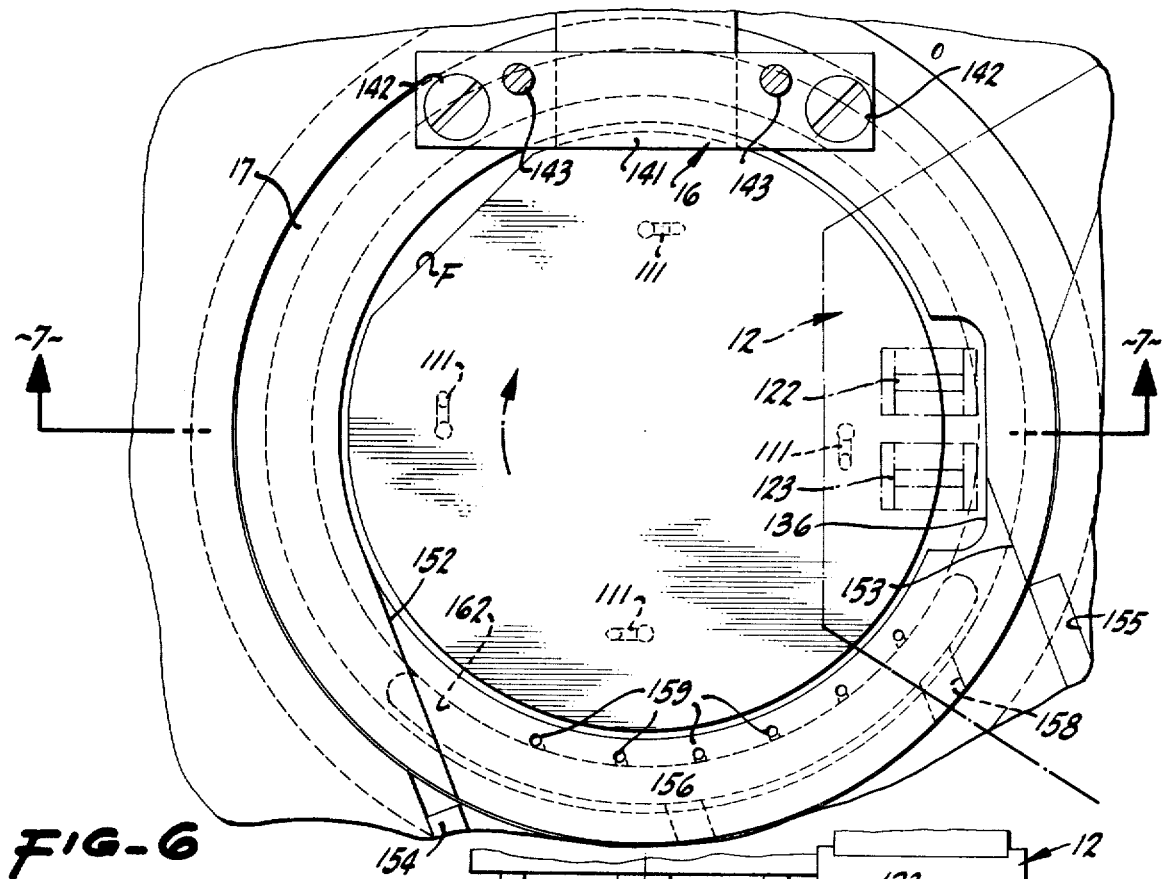
FIG. 6 is a view corresponding generally to the center portion of FIG. 4 taken on an enlarged scale relative thereto and illustrating details of construction of the mechanism for pre-aligning a wafer at the pre-align station prior to movement into a mask aligner.

It will be noted from FIG. 6 that the control ring 17 is provided with a cut-out portion 136 adjacent one side thereof to permit the downward transmission of light signals through the lenses as noted without interference from the control ring.

It should be understood that each wafer passes through the control ring structure twice during its movement between the sending and receiving stations of the apparatus. That is, a wafer first is pre-aligned in such control ring structure, following which it is transferred to the mask alignment station. While such wafer is being finally aligned and exposed at the mask alignment station, another wafer is being pre-aligned at the pre-alignment station. The previously mask aligned and exposed wafer is then retransferred on the turntable into the control ring structure for subsequent sensing for proper exposure and discharge therefrom prior to introduction of another wafer to be pre-aligned therein.

CONTROL RING AND SOLENOID AT PRE-ALIGNMENT STATION

The control ring structure 17 is vertically actuatable to permit selective introduction and removal of wafers therefrom in sequence. Actuation of the control ring structure is effected by the solenoid mechanism 16 is mentioned previously. Such solenoid mechanism is operatively connected with the control ring structure adjacent the reader 12 in the manner seen in FIGS. 2, 4 and 8 through 10.

Figure 9:
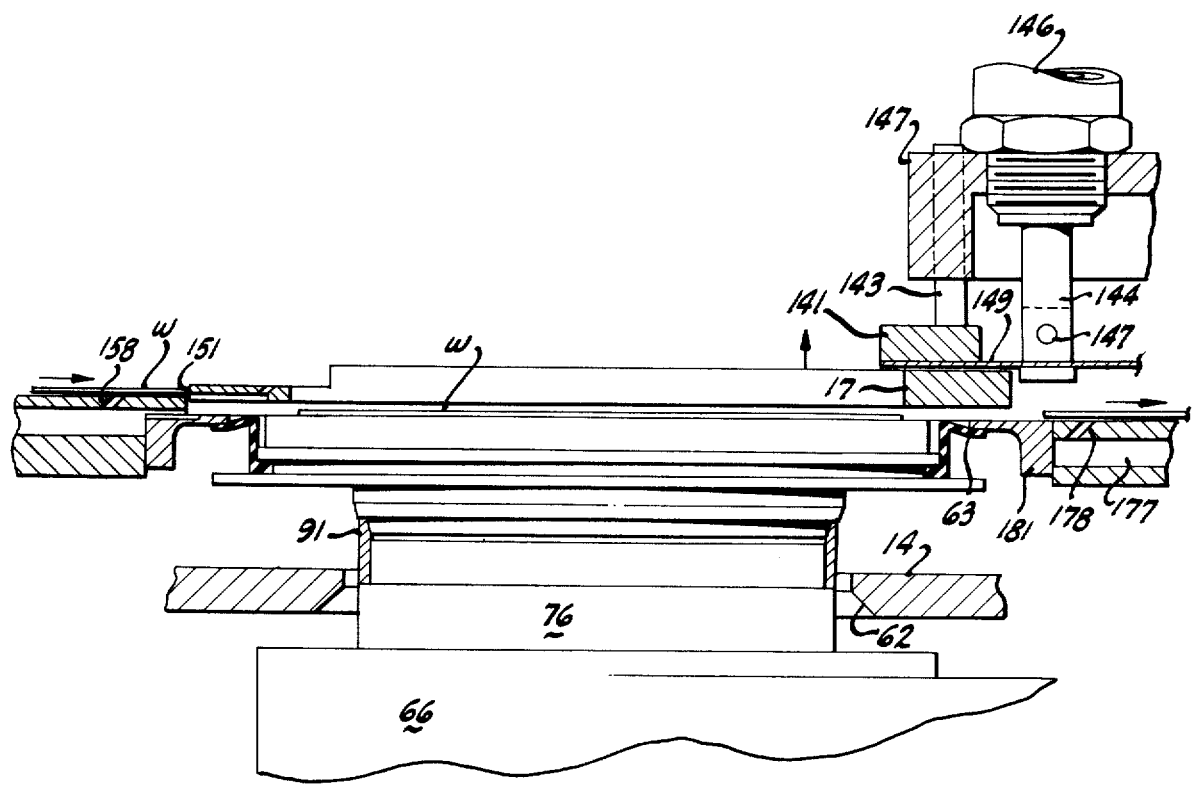
FIG. 9 is a vertical sectional view corresponding generally to FIG. 8 showing that portion of the mechanism in a different operative position.

In that regard, the solenoid structure includes a mounting bracket 141 secured by screw fasteners 142 to one edge of the generally circular control ring. Spaced guide pins 143 project upwardly from the mounting bracket on opposite sides of the control arm 144 of a conventional solenoid generally designated 146, the latter being threadedly engaged with a guide bracket 147 through which the guide pins 143 extend as seen in FIG. 9. The solenoid control arm at its lower end is pivotally connected through a pivot pin 147 and separate shouldered connector 148 with a split leaf spring 149, the connector extending through the split therein.

Figure 8:
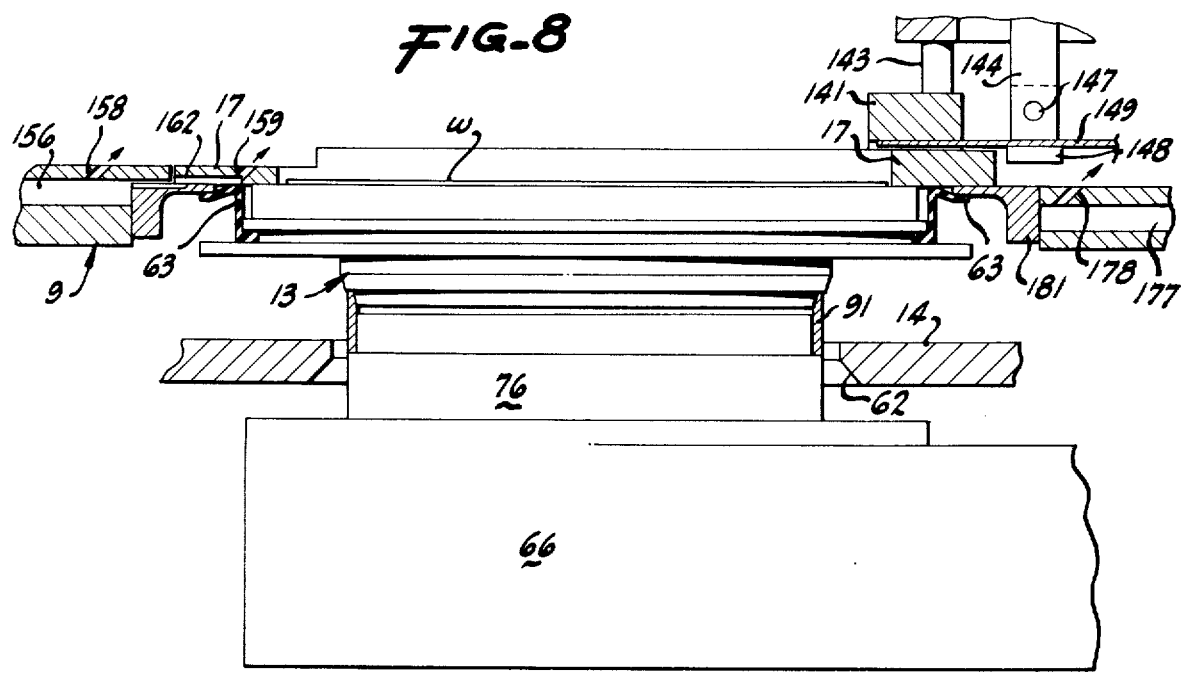
FIG. 8 is a vertical sectional view through the pre-align mechanism of the apparatus taken generally in the plane of line 8—8 of FIG. 1.

It will be noted that the leaf spring is interposed between the solenoid mounting bracket 141 and the control ring 17 and cooperates with gravity in normally holding the control ring in the retracted or down position shown in FIG. 8. When in that position, the chuck 13 is engageable with the underside of the control ring as seen so that pre-alignment of the wafer W supported by the chuck may be effected in the manner described previously. However, upon electrical actuation of the solenoid in known fashion, the control arm 144 is moved upwardly to draw the leaf spring and control ring therewith through the connection thereof with the bracket 141. So long as the solenoid is energized, the control ring will be held in the raised position seen in FIG. 9.

As noted previously, when the control ring 17 is in the lower or down position, wafers may be pre-aligned therein in the manner described. However when the control ring is in the elevated position shown in FIG. 9, wafers may be transported by the turntable to the mask alignment station, and previously mask aligned and exposed wafers may be discharged beneath the surface of the ring to the receiver station.

It will also be noted from FIG. 9 that when the ring is in the upper position a wafer transported from the sending station is precluded from entry into the ring by engagement of the wafer with the periphery of the control ring as indicated by reference numeral 151. In that same regard, when the ring is retracted from the FIG. 9 position with a wafer in the position shown in that figure, such wafer may then be introduced into the ring for pre-alignment therein. However, such retraction of the ring will not be effected if the ring is occupied by another wafer.

Movement of a wafer into the ring may be effected because the ring is provided with two thickness levels as seen in FIGS. 6 and 9. A feed slot defined by parallel walls 152 and 153 in FIG. 6 provide a reduced thickness area of the ring over which the wafer to be introduced may pass when the ring is in the retracted position.

BUFFER STATION AND TRANSFER STATION CONSTRUCTION

As noted previously, the subject apparatus includes a buffer station 9 to which wafers are presented from the sending station prior to introduction into the control ring for pre-alignment. Such buffer station is best seen in FIG. 4 and comprises a transfer and holding section defined by fluid bearing track structure upon which individual wafers in sequence are supported on a bed of air or other suitable gas. In that regard, the track structure includes two laterally adjustable guide rails 154 and 155 secured to the pre-aligned plate structure 26. The construction of the track structure may conform to that described in Lasch et al. application Ser. No. 779,033 identified herein previously and includes two parallel fluid bearing channels 156 and 157 extending longitudinally thereof which are asymmetrically formed in the pre-align plate structure 26, as seen in FIG. 4. That is, channel 156 is closer to the longitudinal axis of the buffer zone track structure than is channel 157. As a result, when supporting fluid is introduced through the spaced jet directional nozzles 158 provided in conjunction with the respective channels, the asymmetrical relationship of such channels causes a wafer W positioned thereover to be rotated as the same is introduced into the control ring. It will also be noted from FIG. 6 that the control ring portion over which the wafer passes includes a series of directional jet nozzles 159 for further insuring proper insertion of a wafer into the ring for pre-alignment therein.

While in FIG. 4 a wafer is shown in dot-dash lines at the buffer station in contact with the edge of the raised control ring, it should be understood that such relationship is shown for purposes of illustration only and that normally a wafer would not be in that position because another wafer is being pre-aligned in the ring. It is only after such pre-alignment has been completed and rotation of the turntable has been started that a wafer is released from the sender station and transported to the buffer station to be positioned in the location noted in FIG. 4.

The fluid bearing channels 156 and 157 are formed by machining passages in the pre-align plate structure 26 and such passages are closed at one end by plugs 161. Such passages are open at their other end and communicate with a curved plenum recess 162 provided in the ring, as best seen in FIG. 6, such plenum communicating with the jets 159 previously mentioned. Thus, when the ring 17 is in its retracted position shown in FIG. 8, the plenum 162 communicates with the channels 156 and 157 so that a wafer passing over the ring will be urged by jets 159 into the ring into the wafer pre-aligning position noted. However, when the ring is elevated, alignment of the plenum and channels is generally disrupted and subsequent wafers are stopped from passing into the ring by the contact noted at reference numeral 151 in FIG. 9.

The channels 156 and 157 are in operative communication with a source of air pressure by means of a transverse channel 163 (FIG. 4) machined in plate structure 26 which is closed at one end by a plug 164. Channel 163 bisects each of the channels 156 and 157 as noted in such figure to introduce air selectively thereinto. At its other end, channel 163 is in communication with a source of air pressure by means of an upright air passage 166.

Referring again to FIG. 9, when it is desired to discharge a previously exposed and mask aligned wafer from the ring to the receiver station, initial movement of the wafer from the ring is effected by a puff or jet of air directed against an edge of the wafer positioned within the ring. Such air jet is effected by means of a puffer air passage 165 angularly directed toward a wafer within the ring, as shown in FIG. 4. For purposes of manufacture, such puffer air passage 165 communicates with a plurality of supply passages in the following manner; at one end the puffer air passage 165 communicates with a plenum chamber 167 and an open groove 168 along the edge of the plate structure 26 which is closed off by a sealing plate 169; the groove 168, in turn, communicates with a transversely extending supply passage 171 machined in the pre-align plate structure, which further communicates with another supply passage 172 machined in the plate structure and closed off at one end thereof by a plug 173; at its inner end passage 172 is in communication with a source of air pressure by means of an upright air passage 174. As a result, when air is selectively introduced from source 174 into passage 172 it passes through the channels mentioned previously and through the puffer jet channel against the edge of the water positioned as oriented in FIG. 9 to effect initial movement of the wafer from that position.

Referring to FIG. 4, also provided in conjunction with the pre-alignment station is a transfer station for receiving exposed and mask aligned wafers from the control ring. Such means comprises a fluid bearing track structure section 175 defined by two parallel fluid channels 176 and 177 which are closed at one of their ends by plugs 179. The other ends of those channels adjacent the control ring are normally blocked off by a mounting ring 181 upon which the control ring is settable as seen in FIGS. 8 and 9. Directional jets 178 communicate with the air passages 176 and 177 and dispense supporting fluid through the surface of the bearing track section to move wafers thereacross as the wafers are discharged sequentially in response to actuation of the puffer jet emanating from passage 166. In that regard, the channels 176 and 177 are in communication with a transverse air supply passage 182 in plate structure 26 which is closed at one end by plug 183 and which at its other end in communication with a source of air under pressure through passage 184. Through a supply passage 185, the puffer jet passage 166 and air support channels 176 and 177 are simultaneously provided with air.

In that connection, referring to FIG. 2, one source of air pressure, designated 186, is illustrated. It should be understood that a similar source of air pressure is adjacent to but not visible in FIG. 2 because it has behind the air source 186 illustrated. Thus, two air pressure lines, one for the buffer station track other for the buffer jet structure section, and the and transfer tracks structure section, are provided which are operated in sequence in accordance with the need to feed wafers into or out of the control ring.

SENDER AND RECEIVER SECTIONS

As noted previously, from FIG. 1, wafers are withdrawn individually and sequentially from a supply magazine 3 at sender station 4 and transferred to the prealignment station 7. Following pre-alignment, and subsequent exposure and mask alignment at the mask alignment station 2, the wafers are discharged in sequence from the control ring structure to the transfer station and then are moved into a discharge magazine 21 positioned at receiver station 22.

Each of the sender and receiver stations includes transfer means defined by fluid bearing track structure sections 6 and 19 which may embody the construction disclosed in the aforementioned Lasch et al. application Ser. No. 779,033. Therefore, details of construction of such fluid bearing track structures and mode of operation thereof will not be described herein. It should be understood, however, that the respective fluid bearing track structures 6 and 19 have portions thereof which extend into the sender station 4 and into receiver station 22 in the manner disclosed in said application so that wafers may be removed from and inserted into the respective supply and discharge magazines by such track structures in the fashion described in said application.

Because the sender and receiver stations are substantially identical in their construction and mode of operation except as otherwise described herein, FIGS. 13 through 16 illustrate details of only the sender station. Corresponding structure is provided at the receiver station.

The sender station comprises a frame work support 187 secured to the mask aligner 1 by a mounting flange 188, the latter being shown in FIG. 1. As seen in FIG. 13, and as noted above, the air bearing track structure 6 extends into and underlies at least partially the supply magazine 3 provided at the sender station so that, as the supply magazine is indexed downwardly, sequential removal of individual wafers from the slots therein will be effected by air emanating from jets provided in track structure 6. Thus, the lowermost wafer in the magazine will be withdrawn in sequence and transported over track structure to the buffer station.

In that regard, the supply and discharge magazines may take various forms and the size thereof is determined in accordance with the size of wafers to be handled therein. Similarly, depending upon customer requirements and wafer size, the spacing between adjacent slots in which wafers are received in the magazines may vary, with normal spacing being either ⅛ inch or 3/16 inch.

The supply magazine is supported on a support base 189 which includes provisions for lateral adjustment to accommodate therein magazines of different sizes. The support base in turn is secured and mounted on a flange member 191 by screw fasteners 192 for movement with the flange member 191, the latter being indexable downwardly during wafer feeding in response to movement of a lead screw 193 which is rotatable in upper and lower bearings 195 through preselected increments by an electric motor 194 through a belt drive 196. The belt passes over pulleys 197 and 198 respectively secured to the motor drive shaft and to the bottom of the lead screw.

Motor 194 includes a conventional magnetic brake construction 199 for insuring quick stops of the lead screw during magazine indexing. Also, the motor utilizes a reverse voltage dynamic brake arrangement of the type described previously with respect to the drive mechanism for the turntable 14 to further insure rapid an accurate stopping of the lead screw during magazine indexing.

While the indexing mechanism illustrated and described herein is generally of the same basic type shown and described in the aforementioned Lasch application Ser. No. 779,033, the present indexing mechanism includes certain improvements and modifications thereover. Also, the magazine utilized with the present apparatus is of a modified construction from that disclosed in said application. As noted from FIGS. 13, 14 and 16, the subject magazine is of generally open construction defined by opposed side walls 201 and 202 formed of metal or suitable plastic in which the spaced slots for receiving the wafers are formed. The side walls are held in operative engagement with each other by a pair of upper metal or plastic connecting rods 203 and 204 and a single centrally located lower metal or plastic connecting rod 206, the latter fitting into a fixture 207 provided in the support base 189. In that regard, fixture 207 is laterally adjustable to permit acceptance of magazines of different sizes therein.

Provision also is made for handling of magazines of varying heights having a capacity for a number of wafers different from the 25 wafers commonly utilized. In that regard, respective upper and lower limit switches 208 and 208' and 209 and 209' are provided. Which of the respective upper or lower limit switches is activated is determined in accordance with the vertical height of the magazine to be accommodated. Such limit switches are selectively actuated or deactuated by a suitable control (not shown) so that only one upper and one lower switch is operable. the limit switches regulate the distance of travel of the support base in the manner shown in FIG. 14 and described in said Lasch et al. application.

Control of rotation of the lead screw 193 is effected by means which sense the presence of a wafer in a slot in the magazine. As seen in FIG. 13, such sensing means comprise a photoelectric sensor defined by a light source 211 which directs a light beam designated 212 towards a receiver 213 positioned opposite the light source. The light beam is directed downwardly at an angle of approximately 3° relative to the vertical which insures sensing of the lowermost wafer without interference from other wafers in the magazine. Such angle is selected in accordance with the spacing of the slots in which the respective wafers are positioned and may be varied as required to meet other needs. When the light beam is broken by the lowermost wafer in the magazine, a signal is transmitted to motor 194 in known fashion to halt indexing of the lead screw so that such a wafer may be removed therefrom on the air bearing track structure as described. Initiation of rotation of the lead screw to index the magazine is effected by a signal transmitted to motor 194 when turntable 14 moves a pre-aligned wafer toward the mask alignment station. In a preferred embodiment, lead screw 193 is provided with a ½ inch pitch which has been determined to be most effective for incremental movement of the magazine during indexing thereof.

At the receiver station 22 at the opposite end of the apparatus, a similar light sensing means is provided to index the discharge magazine upwardly to present a subsequent vacant slot to receive another wafer as the light beam has been broken by a previously inserted wafer into the magazine. Motor and lead screw mechanisms of the type described previously are provided at the receiver station which operate in the opposite direction but in other respects correspond to similar mechanisms at the sender station.

Preferably provided in conjunction with the sender station (a similar mechanism not being required at the receiver station) is the counter-mechanism illustrated in FIGS. 14 and 15. Such counter-mechanism comprises a rotatable circular disc 215 mounted at the top of the lead screw for rotation therewith. Positioned above the disc is a light source 216 which directs a light beam downwardly onto the disc. The disc is provided with a series of radial slots 217 at the edge thereof. In the embodiment illustrated such slots are eight in number, selected in accordance with the preferable utilization of magazines which normally have wafer receiving slots spaced either ⅛ or 3/16 inch vertically from each other.

The spacing of each slot on the disc is correlated to rotation of the lead screw 1/16 of an inch. Therefore, as each slot passes beneath the light source 216 an underlying sensor 218 counts the distance the lead screw has been moved. Thus, it can be determined when the magazine has been indexed ⅛ inch, or 3/16 inch depending upon the type of magazine being indexed. The counter is settable to register and sense passing of each pair or trio of slots passing therebeneath.

Thus, after each two (or three) slot count, the magazine normally is halted to permit withdrawal of a wafer therefrom. However, the photosensor 211-213 is provided to override the effect of the counter if a vacant slot is presented to the photosensor. That is, if the magazine is not filled completely with wafers (for example if certain slots are vacant in a regular or irregular pattern) the photosensor will override the effects of the counting mechanism and will continue to permit the magazine to index until the light beam 212 is interrupted by a subsequent wafer, at which time magazine indexing will be promptly halted as noted previously. In this way, more rapid indexing can be effected without requiring intermittent step by step indexing when magazine slots are unoccupied.

In addition to the various electrical switch constructions described herein, certain other switch constructions preferably are incorporated into the subject apparatus which are not specifically illustrated in the drawings. One such switch is provided in conjunction with the mask alignment station of the conventional mask aligner apparatus with which the subject invention is used. Such a switch is a conventional micro-switch which is actuated as the chuck is elevated by the mask aligner mechanism, as described in the Tancredi patents, to present the wafer to the mask during the fine alignment and exposure procedure. Such switch is provided to prevent rotation of the turntable during mask alignment so that inadvertent rotation and damage to the wafer and the mask system is precluded. Upon lowering of the chuck and exposed wafer therewith at the mask alignment station, the described switch is deactivated to permit rotation of the turntable in the manner noted.

An additional manual switch is added for use of the mask aligner operator so that, if pre-alignment of any particular wafer is not successful and such fact is not determined until the operator begins fine alignment at the mask alignment station, the operator may actuate such manual switch to reject and send the improperly pre-aligned wafer back to the pre-align station for correct pre-alignment thereat. Such switch overrides and precludes indexing of another wafer from the sender station as would normally happen during turntable rotation.

A similar manually operated switch also may be provided which permits the turntable to be rotated selectively without supply magazine indexing if the operator chooses to do so for any other purpose which may be required, and to override the other control functions of the apparatus.

In that connection, the electrical controls for the various sequences of operations have not been illustrated or described in detail herein in that such electrical controls and their functions, and the interrelationships therebetween are within the capability of any competent electrical engineer familiar with sequential machine operations.

Figure 17:
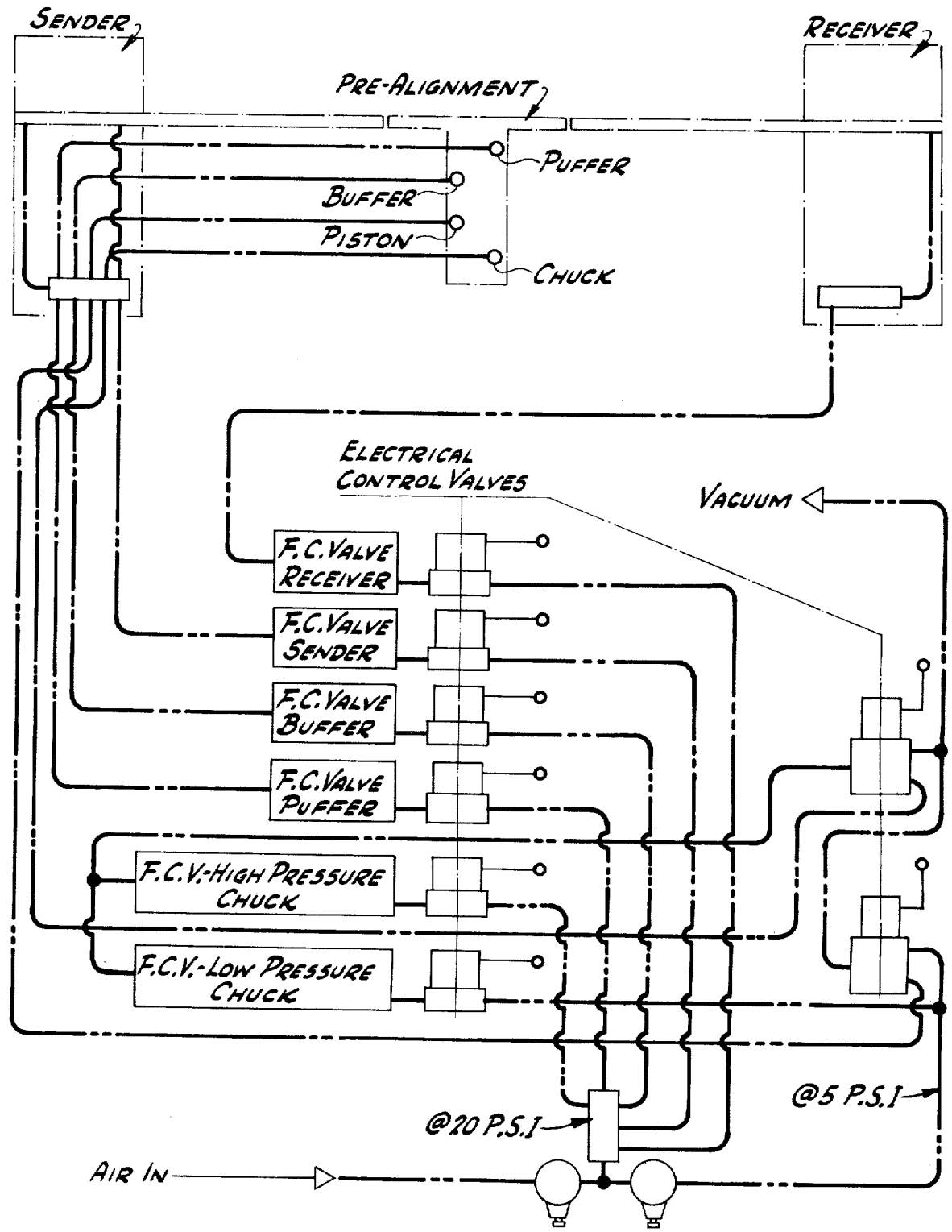
FIG. 17 is a schematic or diagrammatic view of the pressure and vacuum system utilized with the subject apparatus.

With respect to the sequence of introduction of air and vacuum into the various sections and components of the subject apparatus, reference is directed to FIG. 17 which is a schematic air and vacuum flow diagram. Such diagram shows illustrative air pressure preferably utilized, (vacuum levels being widely variable to meet particular needs) and the various flow lines, flow control valves, and electrical valves regulating flow control in response to signals from the various switches described.

SEQUENCE OF OPERATION

Referring to FIG. 1, and the control buttons shown at the sender and receiving stations, when the power-on button is depressed the sending station support platform is automatically indexed to its full up position. The receiver station support platform is indexed to its full down position by depressing the reset button after a full supply magazine has been removed. When the power-on button is depressed, the piston at the pre-alignment station also is elevated automatically to raise a chuck thereabove to the elevated position in which it is ready to receive a wafer for pre-alignment.

Following magazine resetting as noted, the index button at the sender station is depressed which actuates the air source for the air bearing track structure 6 for a time sufficient to remove the lowermost wafer from the supply magazine and to transport the same to the buffer station. Such sender index button also actuates the air source for the buffer track section, and also activates the control ring solenoid to raise the control ring to prevent passage of a wafer from the buffer station into the control ring.

When the first wafer in a given sequence reaches the buffer station, the control ring is retracted by deactivating the solenoid so that such the wafer is transferred onto chuck at the pre-alignment station. Thereafter, sequential operation of the apparatus is automatic.

Once the reader recognizes the presence of the first wafer beneath it, a timer is initiated which allows the wafer to settle onto the chuck. Following passage of a short time interval, alternate air and vacuum are pulsed into and through the chuck to jog the first wafer in a rotary direction beneath the reader in large increments.

When the reader first senses the presence of the flat edge of the wafer therebeneath, pulsing of alternate pressure and vacuum is modified to effect jogging of the wafer in small rotary increments. Such alternate pressure and vacuum pulsing is halted when the reader senses the flat edge of the wafer is in proper pre-alignment position. At that time the piston supporting the chuck is retracted in conjunction with the application of vacuum to the chuck and the wafer carried thereon to hold the chuck and the wafer on the turntable.

The turntable is then rotated 180° to the mask alignment station. In conjunction with such rotation, the solenoid is activated to raise the control ring at the same time the sender magazine is indexed downwardly to present a second wafer in the sequence for transfer to the buffer station. When the first wafer reaches the mask alignment station, the solenoid is deactivated and the control ring structure is retracted to permit the second wafer in the series to enter the chuck positioned within the ring which has been elevated into operative position by the piston. The second wafer is automatically pre-aligned while the first wafer is being mask aligned at the mask alignment station. Following pre-alignment, the reader transmits a signal which causes the piston to be withdrawn and applies vacuum to the chuck and the second wafer thereon.

After completion of the mask alignment and light exposure sequence of the first wafer at the mask alignment station, the turntable is activated, either automatically in response to such light exposure or under control of the operator, to rotate the turntable 180° to bring the first wafer back to the pre-alignment station and to move the second wafer from the pre-alignment station to the mask alignment station. Such rotation of the turntable results in indexing of the sender magazine to present a third wafer to the buffer station. Movement of such third wafer at the buffer station is halted by the control ring which is in the upper position.

At that time the puffer jet is activated, the first wafer is moved onto the discharge track section. Air pressure is introduced into the discharge track section and into the fluid bearing transfer track structure 19 to move the first wafer from the pre-alignment station to the receiver station and into the discharge magazine thereat. Upon receipt of such first wafer in the discharge magazine, the magazine is indexed upwardly to present the next empty slot to the discharge transfer track structure for reception of a subsequent wafer of the series.

Upon the first wafer of the series clearing the control ring structure, the ring is moved to its down position by the solenoid so that the third wafer in the series may be introduced from the buffer station into the pre-alignment station. Following such pre-alignment of the third wafer and mask alignment of the second wafer, the turntable is rotated and a fourth wafer is discharged from the supply magazine to the buffer station as the second wafer is transferred to the receiver station.

The sequences of operations described are repeated until the supply magazine is empty and all wafers therefrom have been pre-aligned, mask aligned and exposed, and presented to the discharge magazine.

Having thus made a full disclosure of preferred embodiments of this invention, reference is directed to the appended claims for the scope of protection to be afforded thereto.

We claim:
1. A method of pre-aligning wafers prior to mask alignment or like treatment thereof without handling, comprising

A. feeding generally circular wafers in sequence from a supply thereof, each of which includes a flat edge portion, to a pre-alignment station, B. providing reading means at said station capable of determining automatically when the flat edge portion of each wafer is in a predetermined orientation, C. rotating each said wafer in sequence at said pre-alignment station beneath said reading means on a directional fluid bearing which supports and imparts rotational movement thereto until said reading means senses each such wafer is in said predetermined orientation, and D. maintaining such orientation of each such wafer while transferring the same to a mask alignment station from said pre-alignment station.

2. The method of claim 1 in which the speed of rotation of said wafers at said pre-alignment station is varied during rotation and pre-alignment thereof on said fluid bearing.

3. The method of claim 1 which further includes

E. feeding said wafers to said pre-alignment station on a fluid bearing.

4. The method of claim 1 which further includes

E. indexing said supply of said wafers to present individual wafers in sequence for feeding to said pre-alignment station.

5. The method of claim 1 which further includes

E. transferring said wafers in sequence from said mask alignment station to a receiver station for collection in a magazine thereat.

6. The method of claim 5 in which said wafer transfer is effected on a fluid bearing.

7. The method of claim 1 which further includes

E. providing additional wafers in sequence to a buffer station adjacent said pre-alignment station ready for introduction to said pre-alignment station when said station is unoccupied.

8. The method of claim 7 which includes

F. initiating rotation of said wafers during introduction of the same in sequence into said pre-alignment station from said buffer station.

9. The method of claim 1 which further includes

E. passing said wafers in sequence back through said pre-alignment station from said mask alignment station prior to transferring the same to a receiver station for collection thereat.

10. The method of claim 1 which further includes

E. providing a discharge magazine at a receiver station spaced from said pre-alignment station, and F. indexing said discharge magazine in sequence as individual wafers are transferred thereto from said mask alignment station.

11. The method of claim 1 in which said wafers are rotated at said pre-alignment station on a directional fluid bearing which supports and imparts rotational movement thereto.

12. The method of claim 11 in which the speed of rotation of said wafers at said pre-alignment station is varied during rotation and alignment thereof on said fluid bearing.

13. A method of pre-aligning wafers prior to mask alignment or like treatment thereof without manual handling, comprising, A. feeding generally circular wafers in sequence from a supply thereof, each of which includes a flat edge portion, to a buffer station adjacent a pre-alignment station, B. providing reading means at said pre-alignment station capable of determining automatically when the flat edge portion of each wafer is in a predetermined orientation, C. providing additional wafers in sequence at said buffer station adjacent said pre-alignment station when such station is unoccupied, D. initiating rotation of each said wafer during introduction of the same in sequence into said pre-alignment station from said buffer station, E. continuing rotation of each said wafer at said pre-alignment station beneath said reading means until said reading means senses each such wafer is in said predetermined orientation and then halting rotation thereof, and F. maintaining the predetermined orientation of each said wafer while transferring the same to a mask alignment station from said pre-alignment station.

14. An apparatus for pre-aligning wafers prior to mask alignment or other treatment thereof, comprising A. means for presenting individual wafers in sequence to a pre-alignment station, each such wafer including a flat portion for use in such pre-alignment, B. means at said pre-alignment station for rotating each said wafer at said station, C. reading means at said station for determining automatically when the flat edge portion of each said wafer is in a predetermined orientation, D. said means for rotating wafers at said pre-alignment station, comprising
  1. a pre-alignment chuck member having directional fluid passages therethrough,
  2. such wafers being positionable in sequence on said chuck member, and
  3. means for selectively introducing fluid through said passages to rotate each wafer presented onto said chuck member without manual handling until the flat edge portion of each such wafer is sensed by said reading means and rotation thereof is halted, and E. means responsive to said reading means to automatically halt rotation of each such wafer when the same is in said predetermined orientation.

15. The apparatus of claim 14 which includes at least two of said pre-alignment chuck members spaced generally 180° from each other which are selectively positionable at said pre-alignment station, said fluid introducing means being operable on each said chuck member while the same is positioned at said pre-alignment station.

16. In combination in an apparatus for pre-aligning wafers prior to mask alignment or like treatment thereof, comprising A. a magazine at a sender station having therein a supply of generally circular wafers each of which includes a flat edge portion for use in pre-alignment thereof;

B. transfer means for receiving individual wafers in sequence from said supply magazine and for transferring the same to a pre-alignment station, C. means at said pre-alignment station to which said wafers are sequentially delivered by said transfer means for controllably rotating each said wafer at said station, comprising
  1. a pre-alignment chuck member having directional fluid flow passages therethrough, and 2. means for selectively introducing and withdrawing fluid through said passages to alternately raise and lower each wafer presented thereto and to effect rotation thereof without manual handling until the flat edge portion of each such wafer is sensed by a reading means and rotation thereof is halted, D. reading means at said pre-alignment station for determining automatically when the flat edge portion of each said wafer is in predetermined orientation, E. means responsive to said reading means to halt rotation of each such wafer when the same is in said predetermined orientation, and F. means for moving each said pre-aligned wafer from said pre-alignment station to a mask aligning station adjacent said pre-alignment station while maintaining said predetermined orientation of each said wafer during such movement.

17. The combination of claim 16 in which said means for rotating said wafers at said pre-alignment station further includes 3. means for altering the sequence of introduction and withdrawal of fluid through said chuck member in response to signals from said reading means.

18. The combination of claim 16 which further includes

G. an extensible and retractable piston beneath said pre-alignment station for selectively elevating and retracting said chuck member to permit introduction and removal of wafers relative to said chuck member.

19. The combination of claim 16 which further includes

G. a turntable on which said chuck member is mounted, and

H. means for rotating said turntable to transfer said chuck member and a wafer carried thereby from said pre-alignment station to said mask alignment station.

20. The combination of claim 19 which includes at least two of said pre-alignment chuck members spaced generally 180° from each other, said fluid introducing and withdrawing means being operable on each said chuck member while the same is positioned at said pre-alignment station and while the same is being transferred on said turntable to said mask alignment station.

21. The combination of claim 19 in which said means for rotating said turntable comprises 1. a motor driven friction wheel engaged with a surface of said turntable, and 2. solenoid and switch structure for regulating the motor which drives said friction wheel.

22. The combination of claim 21 in which said solenoid and switch structure includes a. a positioning roller engageable with said turntable and receivable in a detent therein when said turntable is in a predetermined position, b. such engagement of said roller in said detent actuating a switch of said solenoid and switch structure to deactivate said motor.

23. In combination in an apparatus for pre-aligning wafers prior to mask alignment or like treatment thereof, comprising A. a magazine at a sender station having therein a supply of generally circular wafers each of which includes a flat edge portion for use in pre-alignment thereof, B. transfer means for receiving individual wafers in sequence from said supply magazine and for transferring the same to a pre-alignment station, C. means at said pre-alignment station to which said wafers are sequentially delivered by said transfer means for controllably rotating each said wafer at said station, D. means at a buffer station adjacent said pre-alignment station for maintaining a wafer in position ready for movement into said pre-alignment station when said station is empty, comprising 1. fluid bearing track structure in communication with said transfer means which introduces successive wafers into said pre-alignment station and initiates rotation thereof as the same are introduced into said pre-alignment station, E. reading means at said pre-alignment station for determining automatically when the flat edge portion of each said wafer is in predetermined orientation, F. means responsive to said reading means to halt rotation of each such wafer when the same is in said predetermined orientation, and G. means for moving each said pre-aligned wafer from said pre-alignment station to a mask aligning station adjacent said pre-alignment station while maintaining said predetermined orientation of each said wafer during such movement.

24. The combination of claim 23 in which said means at said buffer station further includes 2. fluid jet means for additionally urging successive wafers in sequence from said buffer station into said pre-alignment station.

25. The combination of claim 23 which further includes

H. extensible and retractable control mechanism at said pre-alignment station for selectively and positively precluding introduction of a wafer thereinto when said station is occupied by another wafer and for permitting such introduction when said station is unoccupied.

26. The combination of claim 25 in which said extensible and retractable control mechanism comprises 1. a control ring member at said pre-alignment station separating the same from said buffer station, and 2. structure for selectively extending and retracting said control ring member, 3. said ring member when extended providing a positive barrier against which a wafer waiting at said buffer station abuts when a preceding wafer is being cleared from said pre-alignment station.

27. The combination of claim 26 in which said control ring member includes fluid jet means extending therethrough for urging a wafer into said pre-alignment station when said control ring member is in its retracted position.

28. The combination of claim 26 in which said structure for extending and retracting said control ring member comprises a. a solenoid operatively connected with said ring member for selectively extending said ring member when said pre-alignment station is occupied to preclude passage of another wafer thereinto from said buffer station.

29. The combination of claim 28 in which said structure for extending and retracting said ring member further includes b. spring means for normally maintaining said ring member in its retracted position.

30. The combination of claim 23 which further includes

H. other transfer means for receiving wafers in sequence following mask alignment thereof and transferring the same to a receiver station for collection thereat.

31. The combination of claim 30 in which said receiver station includes a discharge magazine comprising 1. a slotted wafer carrier to receive a quantity of wafers therein following mask alignment thereof, and in which said combination further includes I. means for indexing said discharge magazine to present open slots in sequence to said other transfer means for reception of wafers thereinto in sequence.

32. The combination of claim 31 in which said indexing means includes 1. a photo-electric sensor for determining when a slot of said discharge magazine is filled so that said magazine may be indexed to present an empty slot to said other transfer means to receive a subsequent wafer therein, and 2. drive means responsive to signals from said sensor for indexing said discharge magazine to present empty slots to said other transfer means in sequence in accordance with discharge of wafers from said mask alignment station to said other transfer means.

33. The combination of claim 30 in which said first mentioned transfer means and said other transfer means each comprises a fluid bearing track structure over which said wafers are transportable on a layer of supporting fluid in sequence relative to said pre-alignment station.

34. The combination of claim 30 which further includes

I. support means for said wafer rotating means and said reading means and said moving means at said pre-alignment station for movably supporting all said means for selective movement relative to said first mentioned and said other transfer means during mask alignment of a wafer at said mask alignment station.

35. The combination of claim 23 in which said supply magazine comprises 1. a slotted wafer carrier having a quantity of said wafers therein, and in which said combination further includes H. means for indexing said supply magazine to present individual wafers in sequence to said transfer means for movement thereby to said pre-alignment station.

36. The combination of claim 35 in which said indexing means includes 1. a photo-electric sensor for determining when a slot in said supply magazine is empty so that said magazine may be indexed past such empty slot until a wafer in a subsequent slot is sensed thereby, and 2. drive means responsive to signals from said sensor for indexing said supply magazine to present wafers in rapid sequence and without delay to a position to be withdrawn from said magazine.

37. The combination of claim 36 in which said indexing means includes 3. a counter mechanism for determining the amount of movement of said wafer carrier during indexing thereof in response to actuation of said drive means.

38. The combination of claim 23 in which said means at said buffer station further includes 2. fluid jet means for additionally urging successive wafers in sequence from said buffer station into said pre-alignment station.

39. The combination of claim 23 which further includes

H. extensible and retractable control mechanism at said pre-alignment station for selectively and positively precluding introduction of a wafer thereinto when said station is occupied by another wafer and for permitting such introduction when said station is unoccupied.

40. The combination of claim 39 in which said extensible and retractable control mechanism comprises 1. a control ring member at said pre-alignment station and separating the same from said buffer station, and 2. structure for selectively extending and retracting said ring member, 3. said ring member when extended providing a positive barrier against which a wafer waiting at said buffer station abuts while a preceding wafer is being cleared from said pre-alignment station.

41. The combination of claim 40 in which said control ring member includes fluid jet means extending therethrough for urging a wafer into said pre-alignment station when said control ring member is in its retracted position.

42. The combination with claim 40 in which said structure for extending and retracting said ring member comprises 4. a solenoid operatively connected with said ring for selectively extending said control ring when said pre-alignment station is occupied to preclude passage of another wafer thereinto from said buffer station.

43. The combination of claim 42 in which said structure for extending and retracting said ring member further includes 5. spring means for normally maintaining said ring member in its retracted position.

44. The combination of claim 23 in which said means for rotating wafers at said pre-alignment station comprises 1. a pre-alignment chuck member having directional fluid flow passages therethrough, and 2. means for selectively introducing and withdrawing fluid through said passages to alternately rais and lower each wafer presented thereto and to effect rotation thereof without manual handling until the flat edge portion of each such wafer is sensed by said reading means and rotation thereof is halted.

45. The combination of claim 43 which further includes

H. an extensible and retractable piston beneath said pre-alignment station for selectively elevating and retracting said chuck to permit introduction and removal of wafers relative to said chuck.

46. The combination of claim 43 in which said means for rotating said wafers at said pre-alignment station further includes
   3. means for altering the sequence of introduction and withdrawal of fluid through said chuck member in response to signals from said reading means.

47. The combination of claim 43 which includes at least two of said pre-alignment chuck members spaced generally 180° from each other, said fluid introducing and withdrawing means being operable on each said chuck member while the same is at said pre-alignment station and while the same is being transferred to said mask alignment station.

48. The combination of claim 43 which further includes
   H. a turntable on which said chuck member is mounted, and
   I. means for rotating said turntable to transfer said chuck member and a wafer carried thereby from said pre-alignment station to said mask alignment station.

49. The combination of claim 47 in which said means for rotating said turntable comprises
   1. a motor driven friction wheel engaged with a surface of said turntable, and
   2. solenoid and switch structure for regulating the motor which drives said friction wheel.

50. The combination of claim 48 in which said solenoid and switch structure includes
   a. a positioning roller engageable with said turntable and receivable in a detent therein when said turntable is in a predetermined position,
   b. such engagement of said roller in said detent actuating a switch of said solenoid and switch structure to deactivate said motor.

51. The combination of claim 23 in which said reading means comprises a fiber-optic sensor having spaced generally parallel light beams for detecting when both said beams are interrupted that the flat edge portion of a wafer rotating therebeneath is properly oriented.

52. An apparatus for pre-aligning wafers prior to mask alignment or other treatment thereof, comprising
   A. means for presenting individual wafers in sequence to a pre-alignment station, each such wafer including a flat edge portion for use in such pre-alignment,
   B. fluid bearing track structure for introducing wafers in sequence into said pre-alignment station, including means to initiate rotation of each wafer during introduction thereof to said station, and for withdrawing wafers in sequence from said station,
   C. means at said pre-alignment station for continuing rotation of each said wafer at said station,
   D. reading means at said station for determining automatically when the flat edge portion of each said wafer is in a predetermined orientation, and
   E. means responsive to said reading means to automatically halt rotation of each such wafer when the same is in said predetermined orientation.

53. The apparatus of claim 51 which further includes
   F. a supply magazine at a sender station for a supply of wafers to be introduced into said pre-alignment station by said fluid bearing track structure,
   G. a discharge magazine at a receiver station for receiving wafers discharged from said pre-alignment station by said fluid bearing track structure,
   H. means for selectively indexing each of said supply and discharge magazines in sequence to withdrawal and introduction of individual wafers relative thereto, and
   I. a photo-electric sensor in conjunction with each of said magazines for effecting selective indexing thereof through magazine drive means provided in conjunction with each of said magazines.

54. The apparatus of claim 5 in which said means for rotating wafers at said pre-alignment station comprises
   1. a pre-alignment chuck member having directional fluid passages therethrough,
   2. such wafers being positioned in sequence on said chuck member, and
   3. means for selectively introducing fluid through said passages to rotate each wafer presented onto said chuck member without manual handling until the flat edge portion of each such wafer is sensed by said reading means and rotation thereof is halted.

55. The apparatus of claim 53 which includes at least two of said pre-alignment chuck members spaced generally 180° from each other, said fluid introducing means being operable on each said chuck member while the same is at said pre-alignment station.

56. The apparatus of claim 51 in which said reading means comprises a fiber-optic sensor having spaced generally parallel light beams for detecting when both said beams are interrupted that the flat edge portion of a wafer rotating therebeneath is properly oriented.

57. The apparatus of claim 55 in which the spacing between said light beams of said sensor is adjustable to adapt said reading means to pre-align wafers of varying sizes.

58. The apparatus of claim 51 which further includes
   F. fluid bearing track structure for introducing wafers in sequence to said pre-alignment station and for withdrawing wafers therefrom.

59. The apparatus of claim 57 in which said fluid bearing track structure for introducing wafers to said pre-alignment station includes means to initiate rotation of each wafer during introduction thereof to said station.

60. The apparatus of claim 57 which further includes
   G. a supply magazine at a sender station for wafers to be fed to said pre-alignment station by one of said fluid track structures, and
   H. a discharge magazine at a receiver station for wafers withdrawn by the other of said fluid track structures.

61. The apparatus of claim 59 which further includes
   I. means for selectively indexing each of said supply and discharge magazines in sequence in response to withdrawal and introduction of individual wafers relative thereto.

62. The apparatus of claim 60 which further includes
   J. a photo-electric sensor in conjunction with each of said magazines for effecting selective indexing thereof through drive means provided in conjunction therewith.

* * * * *

UNITED STATES PATENT AND TRADEMARK OFFICE
CERTIFICATE OF CORRECTION

PATENT NO. : 3,930,684
DATED : January 6, 1976
INVENTOR(S) : CECIL A. LASCH, JR. et al It is certified that error appears in the above-identified patent and that said Letters Patent are hereby corrected as shown below:

Column 7, line 12, "is" should be - as -.

Column 10, line 35, "and" (second occurrence) should be - with -.

Column 11, line 6, "tt" should be - it -.

Column 12, line 16, - to - should be inserted after "72".

Column 14, line 26, correct the spelling of "pre-alignment".

Column 15, line 21, after "16", "is" should be deleted.

Column 17, the sentence beginning at line 65 and extending to column 18, line 2, should read - Thus, two air pressure lines, one for the buffer station track structure section, and the other for the puffer jet and transfer tracks structure section, are provided which are operated in sequence in accordance with the need to feed wafers into or out of the control ring. -.

Column 19, line 7, "an" should be - and -.

UNITED STATES PATENT AND TRADEMARK OFFICE
CERTIFICATE OF CORRECTION

PATENT NO. : 3,930,684
DATED : January 6, 1976
INVENTOR(S) : CECIL A. LASCH, JR. et al It is certified that error appears in the above-identified patent and that said Letters Patent are hereby corrected as shown below:

IN THE CLAIMS

In Claim 44 (column 28, line 57, "rais" should be -- raise --.

Claim 45 (column 28, line 63) "Claim 43" should be -- Claim 44 --.

Claim 46 (column 29, line 1) "Claim 43" should be -- Claim 45 --.

Claim 47 (column 29, line 8) "Claim 43" should be -- Claim 45 --.

Claim 48 (column 29, line 15) "Claim 43" should be -- Claim 45 --.

Claim 49 (column 29, line 23) "Claim 47" should be -- Claim 48 --.

Claim 50 (column 29, line 30) "Claim 48" should be -- Claim 49 --.

Claim 53 (column 29, line 62) "Claim 51" should be -- Claim 52 --.

UNITED STATES PATENT AND TRADEMARK OFFICE
CERTIFICATE OF CORRECTION

PATENT NO. : 3,930,684
DATED : January 6, 1976
INVENTOR(S) : CECIL A. LASCH, JR. et al It is certified that error appears in the above-identified patent and that said Letters Patent are hereby corrected as shown below:

Claim 54 (column 30, line 12) "Claim 5" should be — Claim 53 —.

Claim 55 (column 30, line 24) "Claim 53" should be — Claim 54 —.

Claim 56 (column 30, line 29) "Claim 51" should be — Claim 52 —.

Claim 57 (column 30, line 35) "Claim 55" should be — Claim 56 —.

Claim 58 (column 30, line 39) "Claim 51" should be — Claim 52 —.

Claim 59 (column 30, line 43) "Claim 57" should be — Claim 58 —.

Claim 60 (column 30, line 48) "Claim 57" should be — Claim 58 —.

Claim 61 (column 30, line 55) "Claim 59" should be — Claim 60 —.

Claim 62 (column 30, line 60) "Claim 60" should be — Claim 61 —.

Signed and Sealed this twentieth Day of April 1976

[SEAL]

Attest:

RUTH C. MASON
*Attesting Officer*

C. MARSHALL DANN
*Commissioner of Patents and Trademarks*